United States Patent
Uchiyama et al.

(10) Patent No.: US 9,759,785 B2
(45) Date of Patent: Sep. 12, 2017

(54) MAGNETIC-FIELD DETECTING DEVICE

(75) Inventors: Tsuyoshi Uchiyama, Nagoya (JP); Shinsuke Nakayama, Nagoya (JP); Satoshi Atsuta, Komaki (JP)

(73) Assignees: NATIONAL UNIVERSITY CORPORATION NAGOYA UNIVERSITY, Nagoya-shi (JP); FUJIDENOLO CO., LTD., Komaki-shi (JP)

(*) Notice: Subject to any disclaimer, the term of this patent is extended or adjusted under 35 U.S.C. 154(b) by 0 days.

(21) Appl. No.: 14/004,035

(22) PCT Filed: Mar. 5, 2012

(86) PCT No.: PCT/JP2012/055604
§ 371 (c)(1),
(2), (4) Date: Sep. 9, 2013

(87) PCT Pub. No.: WO2012/121226
PCT Pub. Date: Sep. 13, 2012

(65) Prior Publication Data
US 2013/0342197 A1    Dec. 26, 2013

(30) Foreign Application Priority Data
Mar. 7, 2011 (JP) .................... 2011-049710

(51) Int. Cl.
*G01R 33/02* (2006.01)
*G01R 33/00* (2006.01)
*G01R 33/06* (2006.01)

(52) U.S. Cl.
CPC ......... *G01R 33/02* (2013.01); *G01R 33/0023* (2013.01); *G01R 33/0094* (2013.01); *G01R 33/063* (2013.01)

(58) Field of Classification Search
CPC . G01R 33/0023; G01R 33/02; G01R 33/0094
(Continued)

(56) References Cited

U.S. PATENT DOCUMENTS 3,458,802 A * 7/1969 Koerner .................. 324/253
3,723,988 A * 3/1973 Kardashian ............. 340/551
(Continued)

FOREIGN PATENT DOCUMENTS

JP    A-3-200083    9/1991
JP    A-9-133742    5/1997
(Continued)

OTHER PUBLICATIONS

Cai et al., "Pulse Magnetization Magneto-Impedance Effect in Amorphous Wires for an FM-Type Wireless CMOS MI Sensor," *Journal of Magnetics Society of Japan*, 2001, vol. 25, No. 4-2, pp. 967-970 (with Abstract).
(Continued)

*Primary Examiner* — Son Le
*Assistant Examiner* — Akm Zakaria
(74) *Attorney, Agent, or Firm* — Oliff PLC

(57) ABSTRACT

A magnetic-field detecting device includes a pair of magneto-sensors including respective magnetism sensing portions that sense magnetism, and respective coils sensing changes of magnetic fluxes in the magnetism sensing portions, and an elongate connecting member cooperating with the magnetism sensing portions to constitute a magnetic circuit. A magnetism sensing direction of the magnetism sensing portions coincides with a longitudinal direction of the connecting member to an extent that permits the coils to equally sense a magnetic field applied to the coils the connecting member being formed of a magnetic material having a relative magnetic permeability of at least 100, a magnetic material having a relative magnetic permeability which is at least $\frac{1}{100}$ of that of a magnetic material of the magnetism sensing portions, or the same magnetic material as the magnetism sensing portions the magnetic-field sensor
(Continued)

measuring the magnetism on the basis of a difference between outputs of the coils.

15 Claims, 16 Drawing Sheets

(58) Field of Classification Search
USPC .......... 324/249, 252, 258; 257/241; 340/551
See application file for complete search history.

(56) References Cited

U.S. PATENT DOCUMENTS

| | | | | |
|---|---|---|---|---|
| 5,831,432 | A * | 11/1998 | Mohri | 324/249 |
| 5,889,403 | A * | 3/1999 | Kawase | 324/249 |
| 6,232,775 | B1 * | 5/2001 | Naitoh et al. | 324/249 |
| 6,239,594 | B1 * | 5/2001 | Naito | G01R 33/02 |
| | | | | 324/249 |
| 6,472,868 | B1 * | 10/2002 | Takayama et al. | 324/249 |
| 6,642,714 | B2 * | 11/2003 | Kobayashi et al. | 324/252 |
| 7,417,269 | B2 * | 8/2008 | Ao et al. | 257/241 |
| 2001/0028246 | A1 * | 10/2001 | Aruga et al. | 324/312 |
| 2003/0006763 | A1 | 1/2003 | Takayama et al. | |
| 2003/0155913 | A1 | 8/2003 | Honkura et al. | |
| 2004/0021463 | A1 * | 2/2004 | Miyazawa et al. | 324/252 |
| 2004/0090229 | A1 * | 5/2004 | Kimura | 324/253 |
| 2004/0158439 | A1 * | 8/2004 | Kim | G01D 21/02 |
| | | | | 702/190 |
| 2005/0116708 | A1 | 6/2005 | Honkura et al. | |
| 2006/0038561 | A1 | 2/2006 | Honkura et al. | |
| 2009/0262466 | A1 | 10/2009 | Kurata et al. | |
| 2012/0013332 | A1 * | 1/2012 | Honkura | G01C 17/30 |
| | | | | 324/244 |
| 2013/0181705 | A1 * | 7/2013 | Honkura et al. | 324/252 |

FOREIGN PATENT DOCUMENTS

| | | |
|---|---|---|
| JP | A-11-14722 | 1/1999 |
| JP | A-2000-258517 | 9/2000 |
| JP | A-2000-284030 | 10/2000 |
| JP | 2001-027664 A | 1/2001 |
| JP | A-2001-116773 | 4/2001 |
| JP | A-2002-71770 | 3/2002 |
| JP | A-2003-149311 | 5/2003 |
| JP | 2003-329748 A | 11/2003 |
| JP | A-2008-134236 | 6/2008 |
| JP | A-2008-185436 | 8/2008 |
| JP | A-2009-145327 | 7/2009 |
| JP | A-2010-66049 | 3/2010 |
| JP | A-2012-78198 | 4/2012 |
| WO | WO 03/071299 A1 | 8/2003 |
| WO | WO 2005/019851 A1 | 3/2005 |
| WO | WO 2008/072610 A1 | 6/2008 |

OTHER PUBLICATIONS

International Search Report issued in International Patent Application No. PCT/JP2012/055604 dated May 22, 2012.
International Preliminary Report on Patentability issued in International Patent Application No. PCT/JP2012/055604 dated Jun. 25, 2013 (with translation).
Jan. 19, 2015 Office Action issued in Chinese Patent Application No. 201280011982.3.
Sep. 28, 2015 Search Report issued in European Patent Application No. 12755619.9.
Nov. 26, 2015 the Third Office Action issued in Chinese Application No. 201280011982.3.
Jul. 30, 2015 Office Action issued in Chinese Patent Application No. 201280011982.3.

* cited by examiner

X-DIRECTION POSITION [mm]

X-DIRECTION POSITION [mm]

X-DIRECTION POSITION [mm]

MAGNETIC-FIELD DETECTING DEVICE

TECHNICAL FIELD

The present invention relates to a magnetic-field detecting device, and more particularly to a magnetic-field detecting device which permits accurate detection of a minute magnetic field.

BACKGROUND ART

There has been a need for a magnetic-field detecting device which can detect a magnetic field such as a magnetic signal (magnetic field) generated by living body cells, with high accuracy, for example, with a high degree of resolution. In an attempt to meet this need, there has been proposed a magneto-impedance sensor utilizing an MI (Magneto-Impedance) effect of an amorphous wire (amorphous metal alloy in the form of a wire) wherein an impedance of the amorphous wire being energized with a high-frequency electric current changes in the presence of an external magnetic field. Patent Document 1 discloses an example of such a magneto-impedance sensor. This magneto-impedance sensor is capable of a minute magnetic field as a change of the impedance of the above-indicated amorphous wire, making it possible to detect the magnetic field with a high degree of resolution.

For measuring a subject which generates a minute magnetic field, it is necessary to reduce an influence of the external magnetic field such as the terrestrial magnetism, as well to use the sensor having a high degree of measuring resolution as described above. To reduce the influence of the external magnetic field, it is known to conduct a differential operation of outputs of a plurality of sensors. Namely, one of the sensors is configured to detect both of a magnetic field generated by the subject and the external magnetic field, while the other sensor is configured to detect only the external magnetic field, so that only the magnetic field generated by the above-indicated subject can be obtained on the basis of a difference between the outputs of the two sensors.

PRIOR ART DOCUMENT

Patent Document

Patent Document 1: WO2005/019851A

SUMMARY OF THE INVENTION

Object Achieved by the Invention

By the way, the accurate detection of the magnetic field generated by the subject by using the plurality of sensors as described above not only requires the plurality of sensors to be placed in the same external magnetic field, but also requires one of the sensors to detect both of the magnetic field generated by the subject and the external magnetic field, and other sensor to detect only the external magnetic field. Although the same magnetic field can be detected by the two sensors where these sensors are located close to each other, there is a risk in this case that the magnetic field generated by the subject is detected by both of the two sensors.

As described above, the detection of the magnetic field by the plurality of sensors the outputs of which are subjected to the differential operation still has a problem to be solved.

The present invention was made in view of the background art described above. It is therefore an object of the present invention to provide a magnetic-field detecting device which has a plurality of sensors the outputs of which are subjected to a differential operation, and which permits accurate detection of a magnetic field.

Means for Achieving the Object

The object indicated above is achieved according to a first aspect of the present invention, which provides a magnetic-field detecting device having (a) a pair of magneto-sensors including respective magnetism sensing portions each configured to detect a magnetism, and (b) an elongate connecting member cooperating with the above-described pair of magnetism sensing portions to constitute a magnetic circuit, (c) wherein a magnetism sensing direction of the above-described pair of magnetism sensing portions coincides with a longitudinal direction of the above-described connecting member to an extent that permits the above-described pair of magnetism sensing portions to equally sense a magnetic field applied to both of the above-described pair of magnetism sensing portions, (d) the above-described connecting member being formed of a magnetic material having a relative magnetic permeability of at least 100, a magnetic material having a relative magnetic permeability which is at least $1/100$ of that of a magnetic material of the above-described magnetism sensing portions, or the same magnetic material as the magnetism sensing portions of the above-described magneto-sensors, (e) the above-described magnetic-field detecting device measuring the magnetism on the basis of a difference between outputs of the above-described pair of sensors.

Advantages of the Invention

According to the above-described first aspect of the invention, the magnetism sensing portions of the above-described pair of sensors cooperate with the above-described connecting member to constitute the magnetic circuit, the connecting member being formed of the magnetic material (more specifically, the magnetic material having a small coercive force, such as a ferrite, a permalloy, and an amorphous alloy) having the relative magnetic permeability of at least 100, the magnetic material (more specifically, a cobalt-iron-silicon-boron (Co—Fe—Si—B) alloy, for example) having the relative magnetic permeability which is at least $1/100$ of that of the magnetic material of the magnetism sensing portions, or the same magnetic material as the magnetism sensing portions. Accordingly, both of the sensors are equally subjected to an external magnetic field such as an environmental magnetic field and a magnetic background noise, and are able to detect the external magnetic field. One of the above-described pair of sensors is provided to detect the magnetic field generated by a subject, and a difference of the outputs of the above-described pair of sensors is obtained so as to reduce an influence of the external magnetic field, so that only the magnetic field generated by the subject can be accurately detected.

According to a second aspect of the invention, the magnetic-field detecting device according to the above-described first aspect of the invention is characterized in that (a) the above-described connecting member consists of a plurality of connector segments, and (b) the above-described plurality of connector segments are spaced apart from each other by gaps having dimensions not larger than a cross sectional diameter of connecting portions of the above-described connecting member, or disposed in contact with each other. According to this second aspect of the invention wherein the above-described connecting member consists of the plurality of connector segments and the above-described pair of magneto-sensors are not electrically connected in series to each other within the magnetic circuit, in a strict sense, the two magneto-sensors can equally detect the external magnetic field, and has the same advantage as the above-described first aspect of the invention. Further, the second aspect of the invention wherein the above-described connecting member constituting one magnetic circuit consists of the plurality connector segments makes it possible to selectively design the arrangement of the connector segments such that these connector segments are electrically connected to each other, or not. In the following description, the elements which constitute a magnetic circuit and which are arranged such that a magnetic flux is formed continuously within the magnetic circuit will be described as "the elements connected in series to each other within the magnetic circuit".

According to a third aspect of the invention, the magnetic-field detecting device according to the above-described second aspect of the invention is characterized in that the above-described gaps are filled with magnetic bodies having a relative magnetic permeability of at least 100. This third aspect of the invention, wherein the above-described pair of magneto-sensors are not electrically connected in series to each other within the magnetic circuit in a strict sense, due to the use of the plurality of connector segments as the above-described connecting member, has the same advantage as the first aspect of the invention.

According to a fourth aspect of the invention, the magnetic-field detecting device according to the above-described first aspect of the invention is characterized in that the magnetism sensing portions of the above-described pair of sensors and the above-described connecting member are formed of a same material as a one-piece body. According to this fourth aspect of the invention, the above-described magnetism sensing portions and the above-described connecting member have no variation of their properties among production lots, and an accordingly increased degree of uniformity of the properties, and can be easily produced owing to their formation as the one-piece body.

According to a fifth aspect of the invention, the magnetic-field detecting device according to any one of the first through fourth aspects of the invention is characterized that the magnetism sensing portions of the above-described pair of sensors are disposed close to each other via a gap having a dimension not larger than a cross sectional diameter of connecting portions of the above-described magnetism sensing portions, or disposed hi contact with each other. A relatively short distance between the pair of sensors makes it possible to reduce an overall size of the magnetic-field detecting device.

According to a sixth aspect of the invention, the magnetic-field detecting device according to any one of the first through fifth aspects of the invention is characterized by having shielding means for shielding a subject to be measured, and the above-described pair of sensors, with a magnetic shielding member. In this sixth aspect of the invention wherein the subject and the above-described pair of sensors are shielded by the magnetic shielding member, it is possible to further reduce influences of the external magnetic field on the pair of sensors and on the magnetic field generated by the subject, permitting the magnetic-field detecting device to perform more accurate detection of the magnetic field.

According to a seventh aspect of the invention, the magnetic-field detecting device according to any one of the first through fifth aspects of the invention is characterized by having a grounded covering portion which is formed of a non-magnetic electrically conductive material and which covers at least the magnetism sensing portions of the above-described pair of sensors. This aspect of the invention makes it possible to reduce an influence of a noise generated by the electrically charged magnetism sensing portions on the result of detection by the magnetic-field detecting device.

According to an eighth aspect of the invention, the magnetic-field detecting device according to any one of the first through fifth aspects of the invention is characterized in that (a) the above-described pair of sensors are magnetic impedance sensors, and (b) the magnetism sensing portions of the above-described magneto-sensors are provided by an amorphous wire, while (c) the above-described connecting member is an electrically conductive body, and in that (d) the magnetic-field detecting device further has a parallel conductive body which is electrically connected in parallel to the above-described connecting member and which is formed of a non-magnetic electrically conductive material. According to this aspect of the invention, the amount of electric current flowing through the magnetism sensing portions made of the amorphous wire can be increased.

According to a ninth aspect of the invention, the magnetic-field detecting device according to any one of the first through fifth aspects of the invention is characterized in that (a) the above-described pair of sensors are magnetic impedance sensors, and (b) the magnetism sensing portions of the above-described magneto-sensors are provided by a plurality of amorphous wires, and in that (c) the above-described plurality of amorphous wires are electrically connected in parallel to each other. According to this ninth aspect of the invention wherein the connecting member consists of the plurality of amorphous wires, the amount of an electric current flowing through the connecting member can be increased.

According to a tenth aspect of the invention, the magnetic-field detecting device according to any one of the first through fifth aspects of the invention is characterized in that (a) the above-described pair of sensors are magnetic impedance sensors having respective detecting coils, while (b) the magnetism sensing portions of the above-described magneto-sensors are provided by an amorphous wire, and in that (c) at least one of the above-described pair of sensors is provided with a crystalline metal wire which is electrically insulated from the above-described amorphous wire and disposed along the above-described amorphous wire. According to this tenth aspect of the invention, the use of the above-described crystalline metal wire makes it possible to remove an electric noise from the outputs of the magneto-sensors, resulting in an improvement of the accuracy of detection by the magneto-sensors.

According to an eleventh aspect of the invention, the magnetic-field detecting device according to any one of the first through fifth aspects of the invention is characterized in that (a) the above-described pair of sensors are magnetic impedance sensors having respective detecting coils, while (b) the magnetism sensing portions of the above-described magneto-sensors are provided by an amorphous wire, and in that (c) a stray capacitance of the above-described detecting coils is determined such that a variation of an induced voltage generated by each of the above-described detecting coils upon initiation of application of an electric current to the above-described amorphous wire, and a variation of an induced voltage generated by the above-described detecting coil upon termination of application of the electric current to the above-described amorphous wire take place continuously. According to this eleventh aspect of the invention, output waveforms of the magnetic impedance sensors are broadened, so that an influence of a noise on the results of detection by the sensors can be reduced.

According to a twelfth aspect of the invention, the magnetic-field detecting device according to any one of the first through fifth aspects of the invention is characterized in that (a) the above-described pair of sensors are magnetic impedance sensors having respective detecting coils, while (b) the magnetism sensing portions of the above-described magneto-sensors are provided by an amorphous wire, and in that (c) the magnetic-field detecting device measures: a value of integration of a variation of an induced voltage generated by each of the above-described detecting coils as a result of initiation of application of an electric current to the above-described amorphous wire, during a time period including a moment of a peak value of the above-described variation; a value of integration of a variation of an induced voltage generated by each detecting coil as a result of termination of application of the electric current to the above-described amorphous wire, during a time period including a moment of a peak value of the above-described variation; or a value obtained by subtracting the value of integration of the variation of the induced voltage generated by each detecting coil as the result of termination of application of the electric current to the above-described amorphous wire during the time period including the moment of the peak value of the above-described variation, from the value of integration of the variation of the induced voltage generated by each detecting coil as the result of initiation of application of the electric current to the above-described amorphous wire during the time period including the moment of the peak value of the above-described variation. According to this twelfth aspect of the invention, the magnetic impedance sensors have can detect magnetic signals with a reduced influence of noises and with a high degree of sensitivity.

According to a thirteenth aspect of the invention, the magnetic-field detecting device according to any one of the first through fifth aspects of the invention is characterized in that (a) the above-described pair of sensors are magnetic impedance sensors, while (b) the magnetism sensing portions of the above-described magneto-sensors are provided by an amorphous wire, and in that (c) a width of a pulse of an electric current to be applied to the above-described amorphous wire has a value almost corresponding to a half of a reciprocal of a frequency at which an impedance of the above-described magnetic impedance sensors with respect to the magnetic field has an outstanding change. According to this thirteenth aspect of the invention, the magnetic impedance sensors have a high degree of sensitivity.

According to a fourteenth aspect of the invention, the magnetic-field detecting device according to any one of the first through fifth aspects of the invention is configured such that (a) the above-described pair of sensors are magnetic impedance sensors, while (b) the magnetism sensing portions of the above-described magneto-sensors are provided by an amorphous wire, and in that (c) a repeating frequency of a pulse of an electric current pulse to be applied to the above-described amorphous wire is at least 10 kHz. According to this fourteenth aspect of the invention, the magnetic impedance sensors have a high degree of sensitivity.

According to a fifteenth aspect of the invention, the magnetic-field detecting device according to any one of the first through fifth aspects of the invention is characterized in that (r) the above-described pair of sensors are magnetic impedance sensors having respective detecting coils, while (in) the magnetism sensing portions of the above-described magneto-sensors are provided by an amorphous wire, and in that (y) the above-described pair of detecting coils are electrically connected in series to each other such that electromotive forces generated by the above-described pair of detecting coils upon application of a pulse of an electric current to the above-described amorphous wire have respective opposite phases. According to this fifteenth aspect of the invention wherein the above-described pair of detecting coils are connected to each other such that the electromotive forces generated by the above-described pair of detecting coils upon application of an electric current pulse to the above-described amorphous wire have the respective opposite phases, it is not required to use a circuit for obtaining a difference between the outputs of the two detecting coils.

MODE FOR CARRYING OUT THE INVENTION

Embodiments of this invention will be described in detail by reference to the drawings.

First Embodiment

Figure 1:
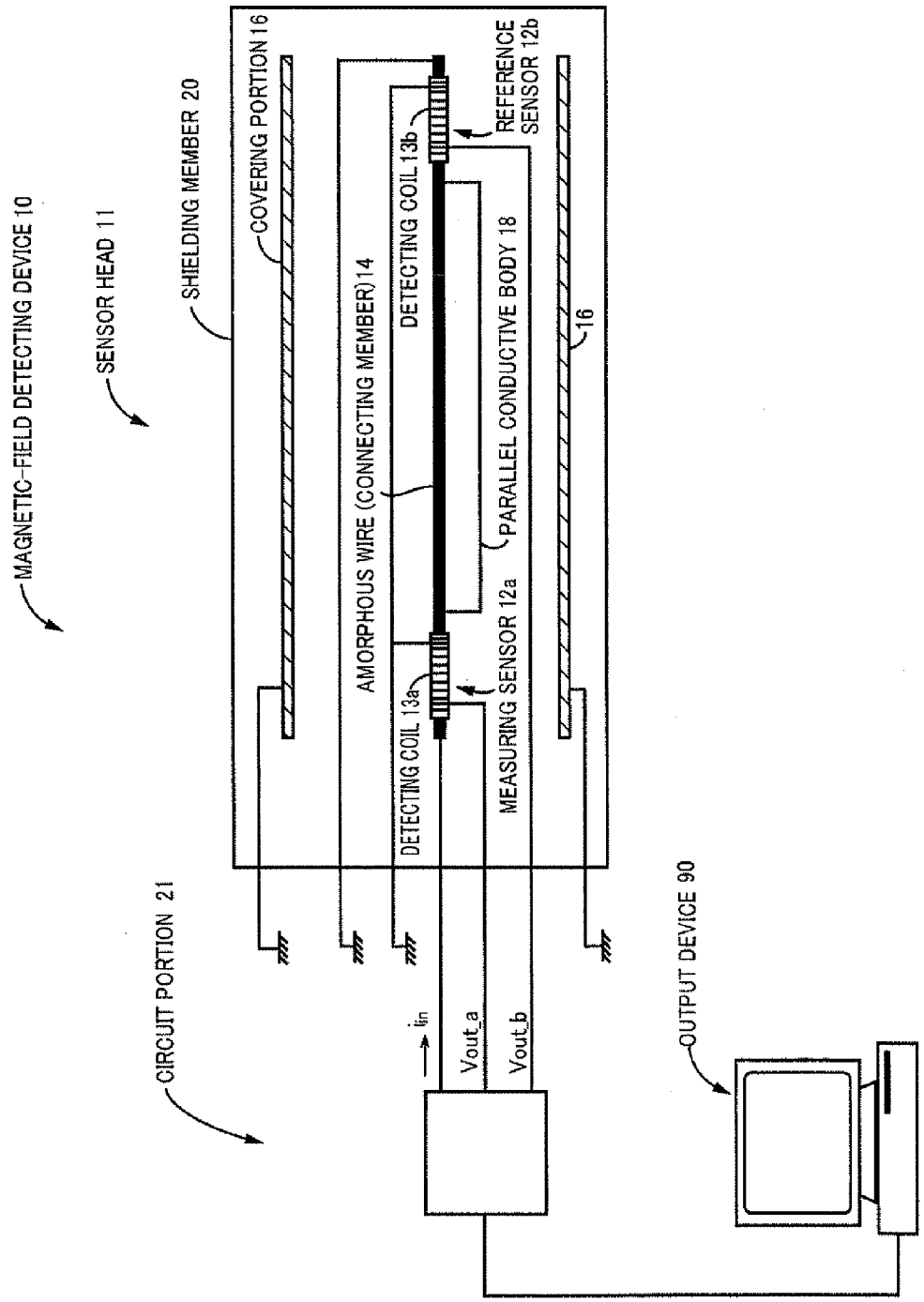
FIG. 1 is a view showing in enlargement an example of an arrangement of a sensor head of a magnetic-field detecting device of the present invention.

FIG. 1 is the view showing in enlargement an example of an arrangement of a magnetic-field detecting device 10 of the present invention. As shown in FIG. 1, the magnetic-field detecting device 10 has a sensor head 11 for detecting magnetic fields, and a circuit portion 21 configured to apply an electric current to the sensor head 11 and to process electric signals generated from the sensor head 11. The sensor head 11 includes a pair of magneto-sensors 12a and 12b (hereinafter collectively referred to as "magneto-sensors 12", unless otherwise specified). One of the magneto-sensors 12 is a measuring sensor 12a configured to detect a magnetic field generated by a subject 50 (shown in FIG. 6), to be measured, while the other of the magneto-sensors 12 is a reference sensor 12b configured not to detect the magnetic field generated by the subject 50, and to detect an external magnetic field such as the terrestrial magnetism that is not caused by the subject 50. The two magneto-sensors 12 are disposed so as to detect the intended magnetic fields, that is, so that the reference sensor 12b does not detect the magnetic field generated by the subject 50. In the present embodiment, the measuring sensor 12a and the reference sensor 12b are spaced apart from each other by a distance of 50 mm, for example.

In the present embodiment, these magneto-sensors 12 are magnetic impedance sensors including respective detecting coils 13 (detecting coils 13a and 13b, which are hereinafter collectively referred to as "detecting coils 13", unless otherwise specified) configured to detect changes of magnetic fluxes in their magnetism sensing portions, and a connecting member in the form of an amorphous wire 14 described below. Each of the detecting coils 13 is a hollow coil a voltage across the opposite ends of which can be detected by an electric circuitry described below. One of those opposite ends is grounded. Described more specifically, a potential difference $v_{out\_a}$ across the opposite ends of the detecting coil 13a provided in the measuring sensor 12a, and a potential difference $v_{out\_b}$ across the opposite ends of the detecting coil 13b provided in the reference sensor 12b can be detected. These detecting coils 13a and 13b respectively provided in the measuring and reference sensors 12a and 12b have the same configuration, that is, have a coil wire diameter of 60 μm, an inside diameter of 0.2 mm, 500 turns and a length of 10 mm.

The amorphous wire 14 extends through the hollow of each detecting coil 13. In the present embodiment, the amorphous wire 14 takes the form of a rod extending (passing) in the longitudinal direction through the hollow portion of the detecting coil 13a and the detecting coil 13b, as shown in FIG. 1. That is, the amorphous wire 14 provided in the present embodiment functions as the connecting member for connecting the two magneto-sensors 12, within a magnetic circuit.

While the amorphous wire 14 is used as the connecting member in the present embodiment, the amorphous wire 14 provided to magnetically connect the two magneto-sensors 12 in series to each other is preferably formed of a magnetic material having a relative magnetic permeability of at least 100, a magnetic material having a relative magnetic permeability which is at least 1/100 of that of a material of the magnetism sensing portions, or the same magnetic material as the magnetism sensing portions.

In the present embodiment, the amorphous wire 14 has a length of 72 mm and a diameter of 30 μm, for example. The amorphous wire 14 is connected at its opposite ends to conductors for application of an electric current $i_{in}$ to the amorphous wire 14. In the specific example of FIG. 1, an oscillator 22 described below is provided to apply the electric current $i_{in}$ to one of the opposite ends of the amorphous wire 14, while the other end is grounded. Namely, the portions of the amorphous wire 14 existing within the detecting coils 13 of the magneto-sensors 12 function as the magnetism sensing portions.

The present embodiment is further configured such that a parallel conductive body 18 formed of an electrically conductive material is connected in parallel to an inner portion of the amorphous wire 14 located between the two detecting coils 13. This parallel conductive body 18 connected to the amorphous wire 14 reduces the electric resistance values at the opposite ends of the amorphous wire 14, as compared with the values in the absence of the parallel conductive body 18, so that a larger amount of electric current can flow through the amorphous wire 14. That is, where the magnetic impedance sensors are used as the magneto-sensors 12 as in the present embodiment, an increase of the amount of electric current flowing through the amorphous wire 14 makes it possible to improve the degree of resolution (detecting accuracy) of the magneto-sensors 12. Described in more detail, the parallel conductive body 18 is a copper wire having a diameter of 0.7 mm and a length of 45 mm. The parallel conductive body 18, which is formed of a non-magnetic material, does not give an influence on the results of detection by the magneto-sensors 12.

The sensor head 11 of the present embodiment is also configured such that the top and bottom surfaces of the magneto-sensors 12 are covered by respective covering portions 16. These covering portions 16 are formed of an electrically conductive material, and are grounded, so that an influence of a variation of the ambient electric field on the magneto-sensors 12 can be reduced. Described more specifically, the covering portions 16 are electrically conductive films in the present embodiment. Where the magneto-sensors 12 are disposed on a substrate, the covering portions may be disposed so as to cover the opposite surfaces of the substrate, or so as to cover not only the opposite surfaces but also the end faces of the substrate. Alternatively, only one covering portion 16 may be provided to cover the top surface of the substrate.

The sensor head 11 of the present embodiment is further configured such that a shielding member 20 is provided to reduce an influence of the external magnetic field, and the magneto-sensors 12 and the subject 50 are located within the shielding member 20. This shielding member 20 surrounding the sensor head 11 is formed of a material such as a permalloy, which has a comparatively high degree of magnetic permeability.

Figure 2:
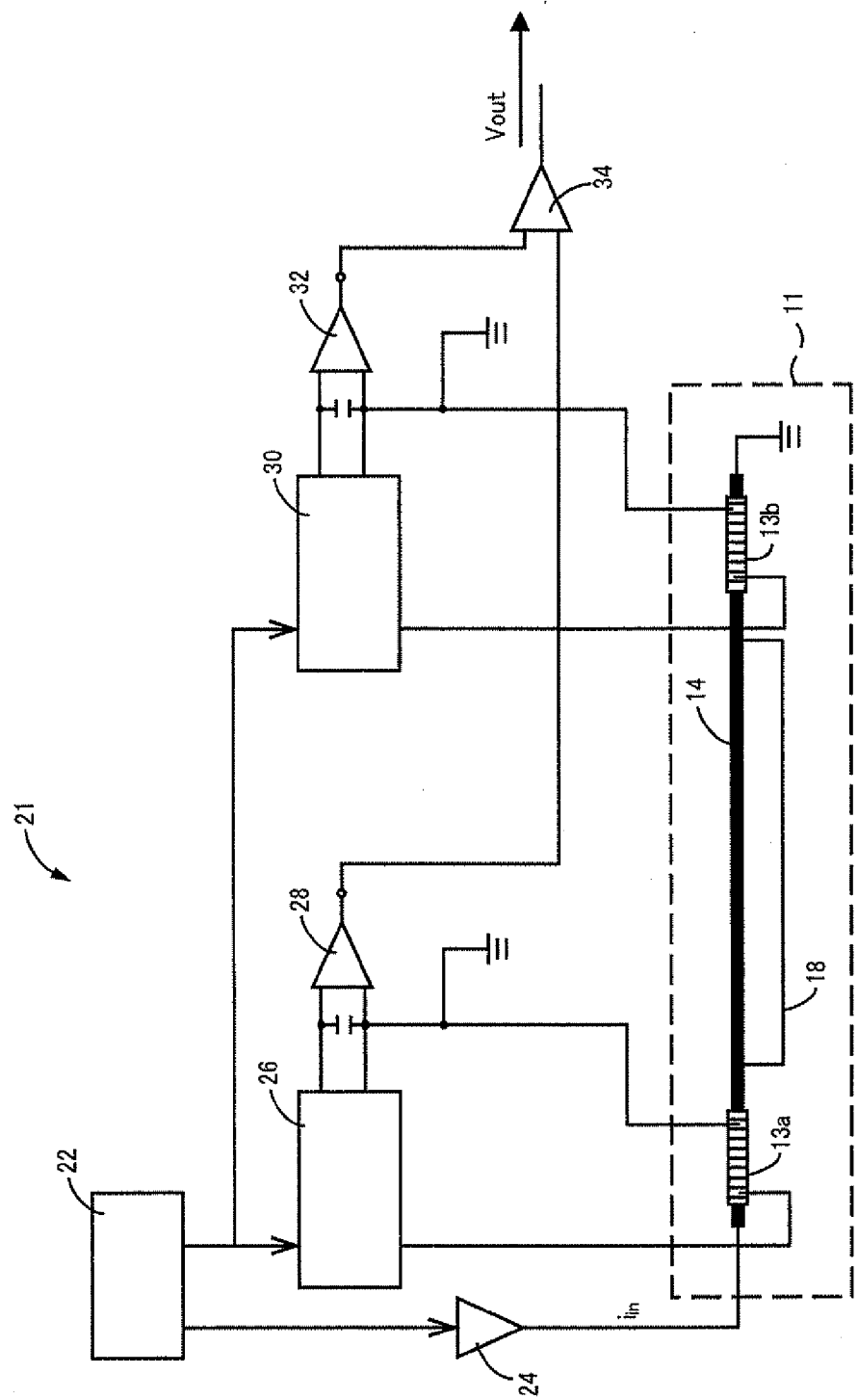
FIG. 2 is a view for explaining major parts of a circuit portion which receives electric signals for driving the sensor head of the magnetic-field detecting device of the present embodiment and which processes output signals of the sensor head.

FIG. 2 is the view for explaining the sensor head 11 of the magnetic-field detecting device 10 of the present embodiment shown in FIG. 1, and parts of a circuit portion 21 which supply and receive signals to and from the sensor head 11. The circuit portion 21 is configured to supply the electric signal $i_{in}$ for driving the sensor head 11, and to process output signals $V_{out\_a}$ and $V_{out\_b}$ of the sensor head 11, for obtaining information relating to the intensities of the magnetic fields detected by the sensor head 11. In the present embodiment, the circuit portion 21 is connected to an output device 90 in the form of a display device such as a monitor, which displays the information relating to the magnetic field intensities detected by the sensor head 11. It is noted that the output device 90 is not an essential element of the magnetic-field detecting device 10 according to the present invention, and that the information on the magnetic field intensities detected by the sensor head 11 may be transmitted as electronic information to any other device.

Figure 3:
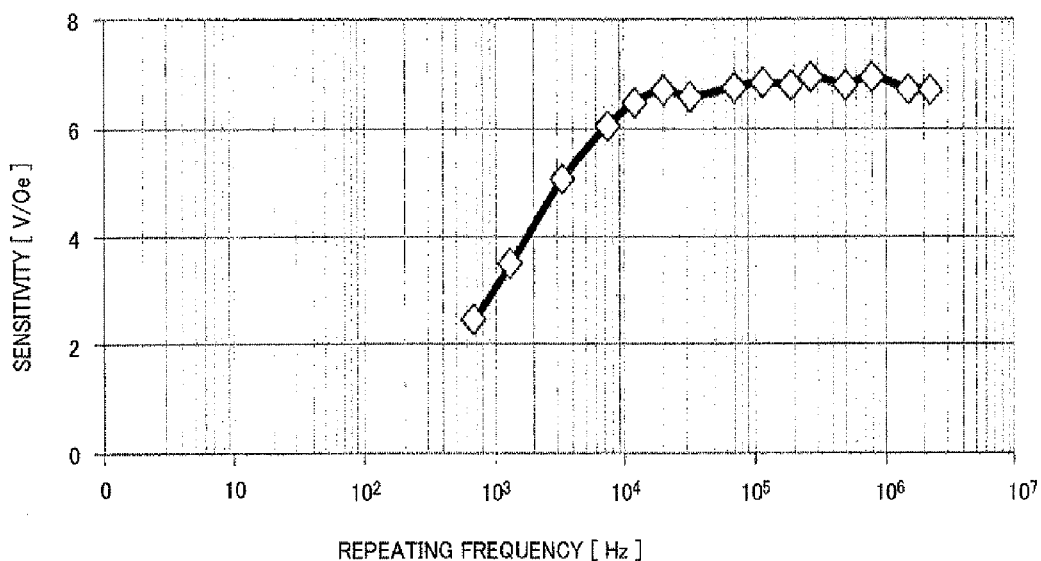
FIG. 3 is a view for explaining a relationship between repeating frequency of a pulse signal to be applied to an amorphous wire, and sensitivity of the sensor.

The oscillator 22 provided in the circuit portion 21 shown in FIG. 2 is configured to generate a pulse signal in the form of a rectangular pulse, on the basis of which the electric current $i_{in}$ applied to the amorphous wire 14. This rectangular pulse is amplified by a predetermined amount by an amplifier 24, and the amplified rectangular pulse is applied to the amorphous wire 14. In the present embodiment, the amplitude of the pulse signal is amplified by 2-3V, for example. FIG. 3 is the view for explaining an example of a relationship between repeating frequency of the pulse signal to be applied to the amorphous wire, and the sensitivity of the sensor. The repeating frequency at which the sensitivity of the sensor is sufficiently high is selected according to the relationship of FIG. 3. In the specific example of FIG. 3 wherein the sensitivity of the sensor is almost constant in a range of the repeating frequency of 10 kHz or higher, the repeating frequency of 10 kHz is selected. In addition, the width or duration of the pulse signal is determined in advance by experimentation or simulation so that the sensitivity of the magnetic impedance sensor is sufficiently high. Described more specifically, where the amount of variation of the impedance of the amorphous wire 14 is largest at 10 MHz, the pulse width is determined to be 50 ns, and the duty ratio is 0.0005.

Sample-hold circuits 26 and 30 respectively receive potential differences across the opposite ends of the detecting coils 13a and 13b, that is, voltages (electromotive forces) across the opposite ends. Each of the sample-hold circuits 26, 30 generates an output as a result of integration of an induced voltage generated by the corresponding coil as a result of a rise of the pulse signal to be applied (as a result of initiation of application of the electric current) to the amorphous wire 14, during a time period from a moment of the rise (point of time t1 indicated in FIG. 4) to a moment of a peak value of the induced voltage (point of time t2 indicated in FIG. 4), more specifically, during a time period of 10 ns-50 ns, for example. To this end, the sample-hold circuits 26, 30 receive the pulse signal from the above-described oscillator 22, so that the sample-hold circuits 26, 30 are turned on upon rising of the pulse signal. Buffer amplifiers 28 and 32 feed the outputs of the respective sample-hold circuits 26 and 30 to a differential amplifier 34.

Figure 4:
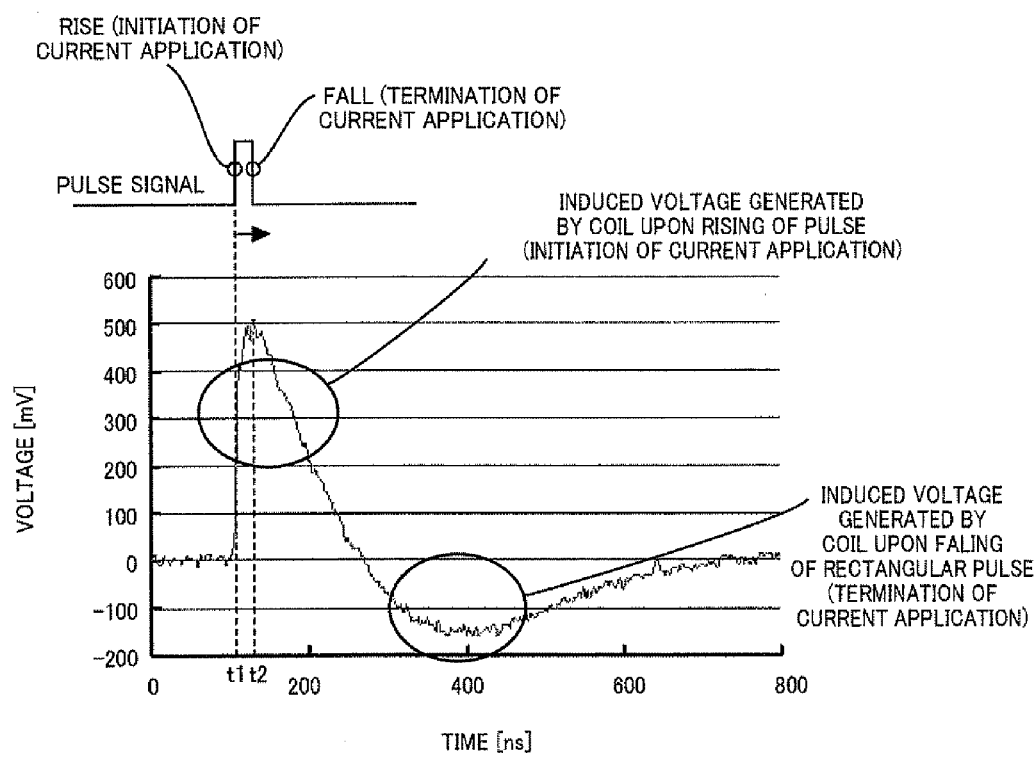
FIG. 4 is a view indicating a waveform of the pulse signal to be applied to the amorphous wire, and a waveform of an induced voltage generated by a detecting coil, for comparison with each other.

Each of the detecting coils 13 is required to be configured such that a variation of the induced voltage generated by the detecting coil 13 upon rising of the pulse signal to be applied (upon initiation of application of the electric current) to the amorphous wire 14, and a variation of the induced voltage generated by the detecting coil 13 upon falling of the pulse signal (upon termination of application of the electric current) take place continuously, as indicated in FIG. 4, namely, such that a portion of the waveform of the induced voltage does not include a point of time at which the induced voltage stays zero between the rising and the falling of the pulse signal. The detecting coils 13 having the coil wire diameter of 60 μm, inside diameter of 0.2 mm, 500 turns and length of 10 mm described above by way of example meet the above-indicated requirement of configuration.

Referring back to FIG. 2, the differential amplifier 34 amplifies a difference between the outputs of the sample-hold circuits 26 and 30 received via the respective buffer amplifiers 28 and 32, to generate its output $v_{out}$. Described more specifically, the differential amplifier 34 generates the output $v_{out}$ by calculating the difference between the output of the sample-hold circuit 26 which is received via the buffer amplifier 28 and which relates to the detecting coil 13a of the measuring sensor 12a, and the output of the sample-hold circuit 30 which is received via the buffer amplifier 32 and which relates to the detecting coil 13b of the reference sensor 12b.

Figure 5:
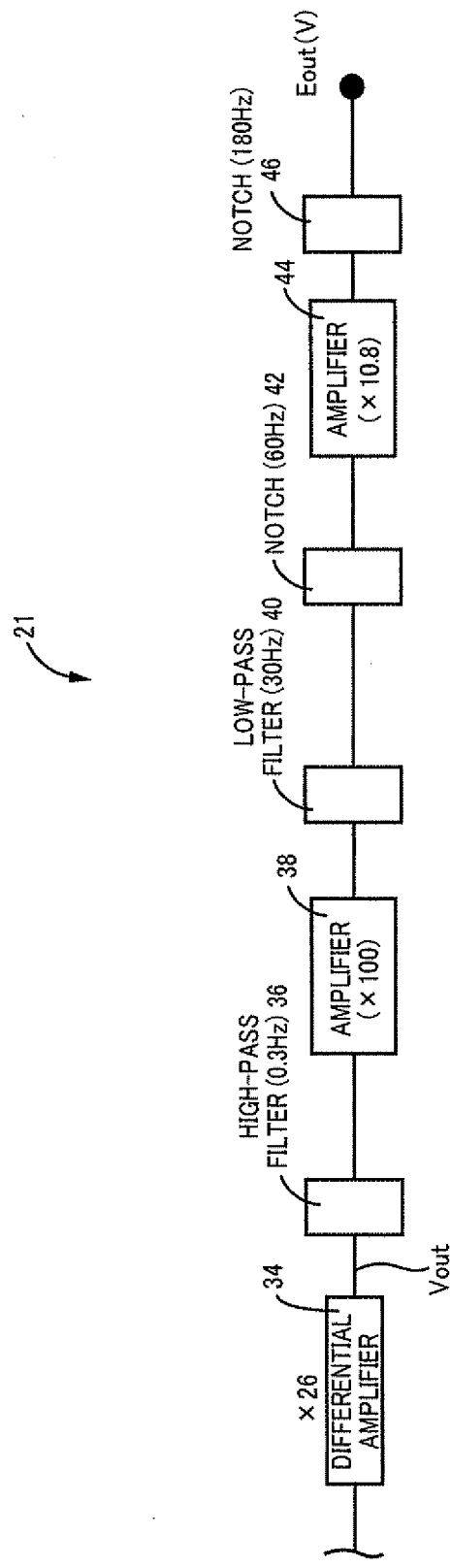
FIG. 5 is a view for explaining major parts of the circuit portion of the magnetic-field detecting device of the present embodiment, which parts are different from the parts of FIG. 2.

FIG. 5 is the view for explaining the other major parts of the circuit portion 21 of the magnetic-field detecting device 10 of the present embodiment, namely, the parts which implement a further processing operation of the output $v_{out}$ of the differential amplifier 34 of FIG. 2. That is, the circuit portion 21 includes the circuit shown in FIG. 2, and the circuit shown in FIG. 5. It is noted, however, that the differential amplifier 34 is shown redundantly in both of FIGS. 2 and 5.

Described more specifically, a predetermined low-frequency component (lower than 0.3 Hz, for example) of the output $v_{out}$ of the differential amplifier 34 is removed by a high-pass filter 36. Further, an output of the high-pass filter 36 is amplified by a predetermined amount by an amplifier 38. Then, a predetermined high-frequency component (higher than 30 Hz, for example) of an output of the amplifier 38 is removed by a low-pass filter 40. Successively, a predetermined frequency component (60 Hz, for example) of an output of the low-pass filter 40 is removed by a notch filter 42, and an output of the notch filter 42 is amplified by an amplifier 44. Further, another predetermined frequency component (180 Hz, for example) of an output of the amplifier 44 is removed by a notch filter 46, whereby an output Eout(V) is generated. This output Eout(V) is converted according to a predetermined conversion formula into a magnetic field intensity or strength, that is, into an intensity or strength of the magnetic field generated by the subject 50.

Figure 6A:
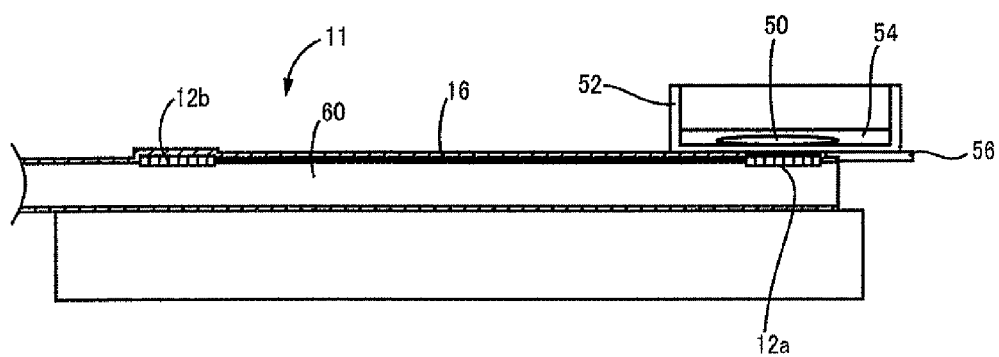
FIG. 6 are views for explaining a manner of detection of a magnetic field of a cell tissue by the magnetic-field detecting device of the present embodiment, showing in enlargement an arrangement around the sensor head of the magnetic-field detecting device.
Figure 6B:
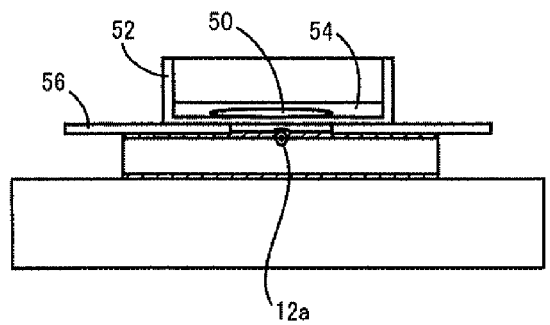

FIG. 6 are views for explaining a manner of detection of the magnetic field of a cell tissue by the magnetic-field detecting device 10 of the present embodiment, showing in enlargement an arrangement around the sensor head 11 of the magnetic-field detecting device 10. FIG. 6(a) is a front elevational view of the sensor head 11 placed in a horizontal plane, which front elevational view is taken in a horizontal direction perpendicular to the longitudinal direction of the magneto-sensors 12, while FIG. 6(b) is an end elevational view of the sensor head 11 placed in the horizontal plane, which end elevational view is taken in a horizontal direction parallel to the longitudinal direction of the magneto-sensors 12.

In the example of FIG. 6, the subject 50 is a cell tissue of a living body. Namely, a resinous container 52 for maintaining the subject 50 in the form of a cell tissue of a living body in a live state is disposed over the measuring sensor 12a. As shown in FIG. 6, the magneto-sensors 12 are fixed on a substrate 60, and a resinous sheet 56 for supporting the resinous container 52 is disposed on the substrate 60 such that the resinous sheet 56 projects from the substrate 60. A distance between the subject 50 and the measuring sensor 12a, which is determined by a thickness of the bottom wall of the resinous container 52 and a thickness of the resinous sheet 56, is adjusted to a value which permits the measuring sensor 12a to measure the magnetic field generated by the subject 50. The sensor head 11 may be considered to include the above-described substrate 60.

The resinous container 52 accommodates a Krebs liquid 54 for reserving the subject 50 in the form of the cell tissue of the living body, such that the subject 50 is immersed in the Krebs liquid 54 so that the subject 50 is maintained in a live state. For holding the Krebs liquid 54 at a temperature suitable for maintaining the subject 50 in the live state, a suitable heating device and a device for circulating the Krebs liquid 54 (not shown in FIG. 6) may be provided.

EXAMPLES

Figure 7A:
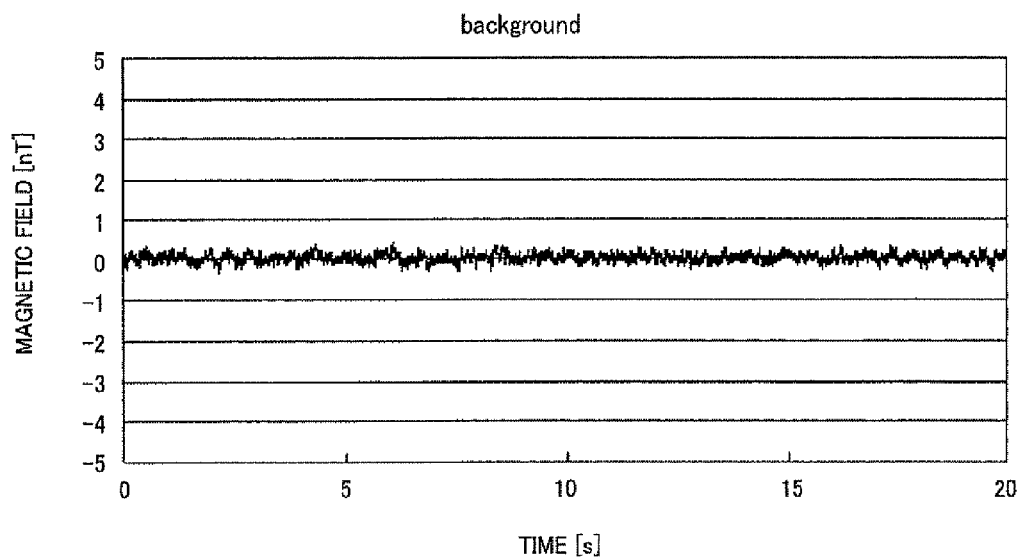
FIG. 7 are views indicating changes with the time of an intensity of a magnetic field obtained by the magnetic-field detecting device of the present invention, FIG. 7(a) indicating the change where a subject was not placed on the detecting device while FIG. 7(b) indicating the change where a subject in the form of a smooth muscle cell tissue of the bladder of a guinea pig was placed on the detecting device.
Figure 7B:
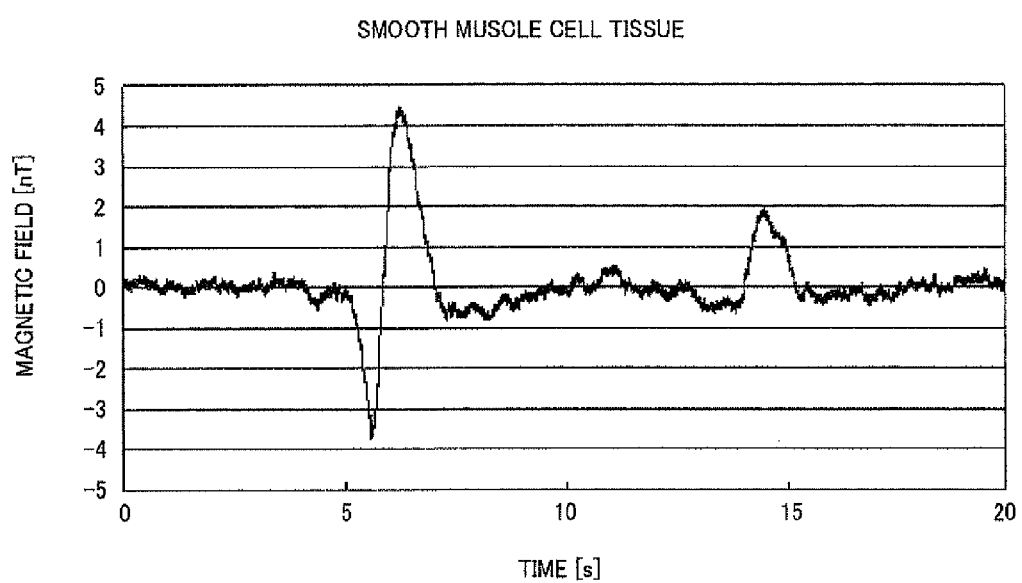

There will be described examples of measurement, by the above-described magnetic-field detecting device 10, of an electric current flowing through the subject 50 in the form of a smooth muscle cell tissue of the bladder of a guinea pig. FIG. 7 are the views indicating changes with the time of an intensity of a magnetic field obtained by the magnetic-field detecting device 10 of the present invention, FIG. 7(a) indicating the change where the subject 50 was not placed on the detecting device 10, namely, the change of only the intensity of the external magnetic field, while FIG. 7(b) indicating the change where the subject 50 in the form of the smooth muscle cell tissue of the bladder of the guinea pig was placed on the detecting device 10. In the examples, the amorphous wire 14 and the subject 50 are spaced apart from each other by a distance of 1-3 mm, and the Krebs liquid was maintained at 30-35° C.

The output of the magnetic-field detecting device 10 according to this invention is a difference between the output of the measuring sensor 12a and the output of the reference sensor 12b. Therefore, this output should be ideally zero in the Example of FIG. 7(a). Namely, the magnetic field intensity actually detected in the Example of FIG. 7(a) is based on a detecting noise. As is apparent from FIGS. 7(a) and 7(b), this detecting noise is sufficiently smaller than the magnetic field intensity detected in the Example of FIG. 7(b) in which the subject 50 was placed on the detecting device 10. FIG. 7(b) indicates that the magnetic field intensity generated by the subject 50 was detected with a sufficiently high degree of resolution.

Figure 8A:
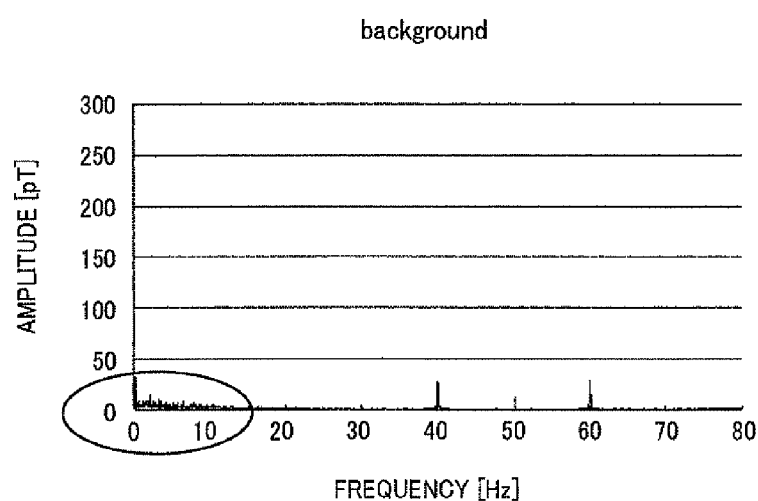
FIG. 8 are views indicating a result of a Fourier analysis of the experiments of FIG. 7(a), FIG. 8(b) being an enlarged view corresponding to a portion of the frequency range of FIG. 8(a)
Figure 8B:
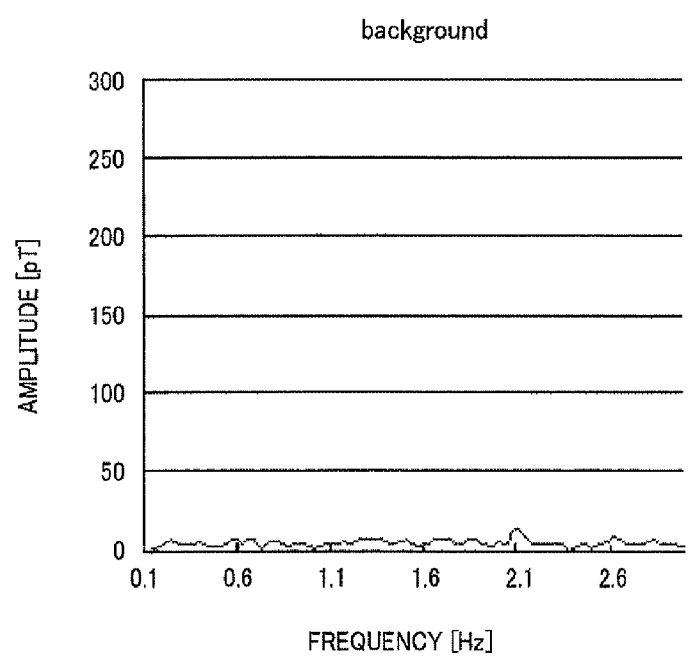
Figure 9A:
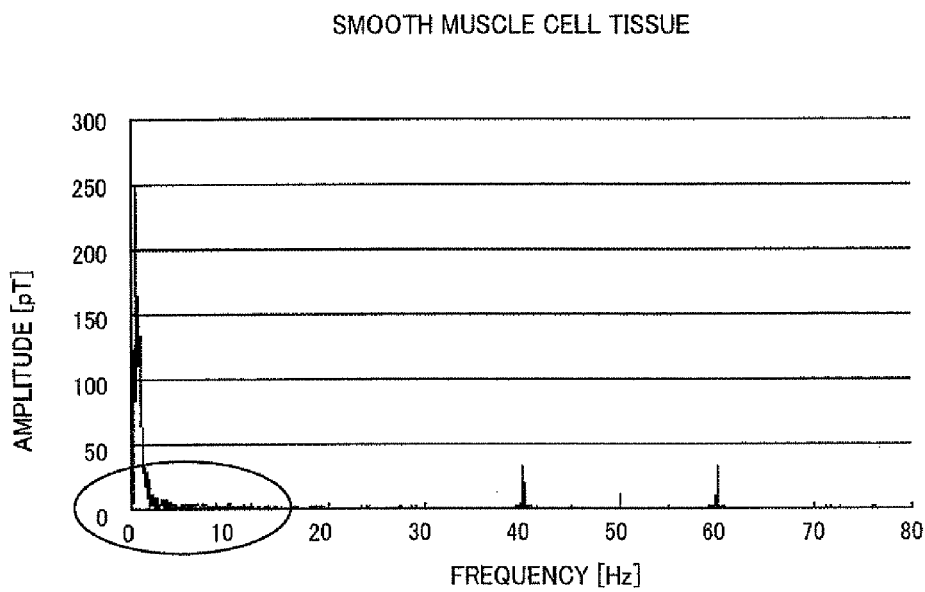
FIG. 9 are views indicating a result of a Fourier analysis of the experiments of FIG. 7(b), FIG. 9(b) being an enlarged view corresponding to a portion of the frequency range of FIG. 9(a)
Figure 9B:
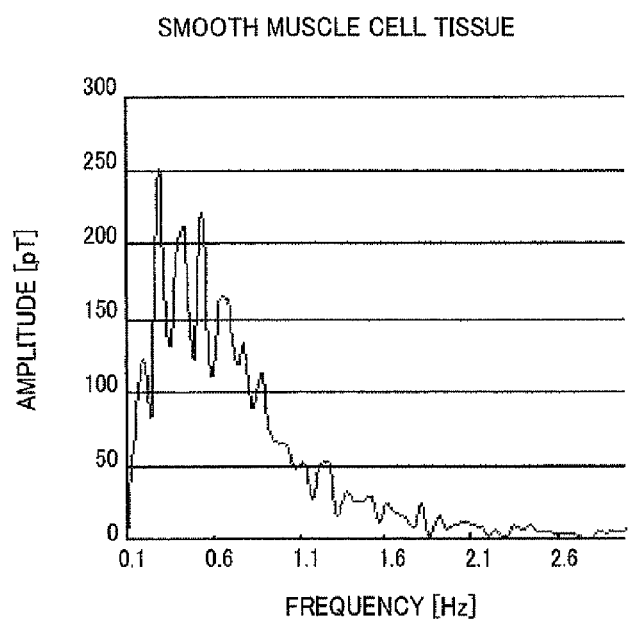

FIGS. 8 and 9 are the views indicating results of a Fourier analysis of data obtained in the Examples of FIGS. 7(a) and 7(b). FIGS. 8(b) and 9(b) are enlarged views corresponding to a portion of the frequency range of FIGS. 8(a) and 9(a). Comparison of the results indicated in FIGS. 8(b) and 9(b) reveals that the magnetic-field detecting device 10 according to the present invention permits detection of the magnetic field with a high degree of resolution of 10 pT or smaller.

The magnetic-field detecting device 10 according to the above-described embodiment of the invention is configured such that the magnetism sensing portions of the magneto-sensors 12 are connected in series to each other within the magnetic circuit, by the connecting member 14 in the form of the amorphous wire, which is formed of a magnetic material having a relative magnetic permeability of at least 100, a magnetic material having a relative magnetic permeability which is at least 1/100 of that of a magnetic material of the magnetism sensing portions, or the same magnetic material as the magnetism sensing portions. Accordingly, both of the magneto-sensors 12 are equally subjected to the external magnetic field such as an environmental magnetic field and a magnetic background noise, and are able to detect the external magnetic field. The measuring sensor 12a is provided to detect the magnetic field generated by the subject 50, and a difference of the output of the measuring sensor 12a with respect to the output of the reference sensor 12b is obtained so as to reduce an influence of the external magnetic field, so that only the magnetic field generated by the subject 50 can be accurately detected.

The above-described embodiment is further configured such that the grounded covering portions 16 formed of a non-magnetic electrically conductive material are provided to cover the detecting coils 13 of the magneto-sensors 12, making it possible to reduce an influence of an electric field noise generated by the electrically charged magneto-sensors 12, on the result of detection by the detecting coils 13.

The above-described embodiment is also configured such that the magneto-sensors 12 are magnetic impedance sensors (MI sensors), while the connecting member 14 is an amorphous wire, and such that the parallel conductive body 18 formed of a non-magnetic electrically conductive material is electrically connected in parallel to the connector member 14, whereby the amount of electric current flowing through the amorphous wire 14 can be increased.

The above-described embodiment is further configured such that the magneto-sensors 12 are magnetic impedance sensors having the detecting coils 13, while the connecting member 14 is an amorphous wire, and such that a stray capacitance of the detecting coils 13 is determined such that a variation of the induced voltage generated by each detecting coil 13 upon initiation of application of the electric current to the amorphous wire 14, and a variation of the induced voltage generated by the detecting coil 13 upon termination of application of the electric current take place continuously, whereby the output waveforms of the magnetic impedance sensors are broadened, so that the influence of the noise on the results of detection by the sensors can be reduced.

The above-described embodiment is also configured such that the magneto-sensors 12 are magnetic impedance sensors having the detecting coils 13, while the connecting member 14 is an amorphous wire, and such that each magneto-sensor 12 measures a value of integration of the induced voltage generated by the corresponding coil, during the time period including the moment of the peak value of the induced voltage, making it possible to detect a change of the magnetic field in the magnetism sensing portion upon application of the electric current pulse to the magnetism sensing portion, such that the change corresponds to the rise of the electric current pulse. The magnetic field in the magnetism sensing portion includes the magnetic field generated by the magnetism sensing portion per se and the external magnetic field existing around the magnetism sensing portion.

The above-described embodiment is further configured such that the magneto-sensors 12 are magnetic impedance sensors while the connecting member 14 is an amorphous wire, and such that the width or duration of the pulse of the electric current to be applied to the amorphous wire has a value almost corresponding to a half of a reciprocal of the frequency at which the impedance of the above-described magnetic impedance sensors with respect to the magnetic field has an outstanding change, so that the magnetic impedance sensors have a high degree of sensitivity.

The above-described embodiment is also configured such that the magneto-sensors 12 are magnetic impedance sensors while the connecting member 14 is an amorphous wire, and such that the repeating frequency of the pulse of the electric current to be applied to the amorphous wire is at least 10 kHz, so that the magnetic impedance sensors have a high degree of sensitivity.

Then, other embodiments of this invention will be described. In the following description, the same reference signs will be used to identify the same elements in the different embodiments, which will not be described redundantly.

Second Embodiment

Figure 10:
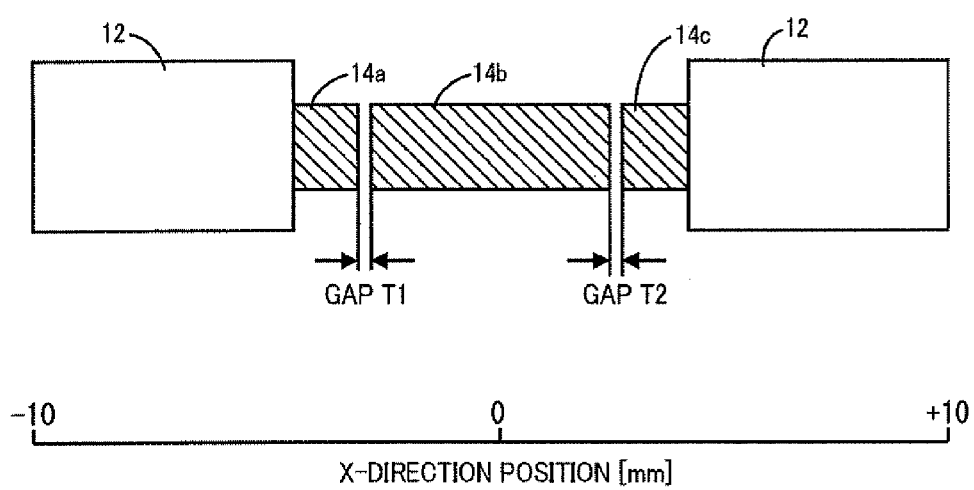
FIG. 10 is a view for explaining another type of a connecting member used in the magnetic-field detecting device of the present invention.

FIG. 10 is the view for explaining another type of the connecting member 14 used in the magnetic-field detecting device of the present invention. While the connecting member 14 used in the above-described first embodiment takes the form of one rod extending in its longitudinal direction, the connecting member 14 used in the embodiment of FIG. 10 consists of three connector segments 14a, 14b and 14c. The connector segments 14a and 14b are spaced apart from each other by a gap T1, while the connector segments 14b and 14c are spaced apart from each other by a gap T2. The connector segments 14a and 14c extending through the detecting coils 13 of the magneto-sensors 12 function as the magnetism sensing portions.

A dimension of the gaps T1 and T2 is determined to be not larger than a cross sectional diameter of the above-described connecting member, or alternatively the connector segments 14a, 14b, 14c are disposed in contact with each other, so that the amount of leakage of magnetic fluxes through the gaps can be reduced, and the amount of introduction of external magnetic fluxes into the gaps can be reduced. Where the connecting member does not have a circular cross sectional shape, the expression "cross sectional diameter" is interpreted to mean a diameter of a circle which has the same cross sectional area as the connecting member having the non-circular cross sectional shape. Although the gaps T1 and T2 preferably have the same dimension, these gaps may have different dimensions, as long as the dimensions satisfy the above-indicated requirement. Where the connector segments 14a and 14b and the connector segments 14b and 14c are not disposed in contact with each other, the end faces of the connector segments 14a and 14b which are opposed to each other via the gap T1, and the end faces of the connector segments 14b and 14c which are opposed to each other via the gap T2 are electrically connected to each other by respective electrically conductive bodies not shown, so that an electric pulse current can flow through the connector segments 14a-14c. In this respect, it is noted that since a flow of the electric pulse current through the connector segments 14b which does not function as the magnetism sensing portions of the magneto-sensors 12 is not essential, the end faces of the connector segments 14a and 14c which are opposed to each other via the connector segment 14b may be electrically connected to each other by an electrically conductive body not shown.

Figure 11A:
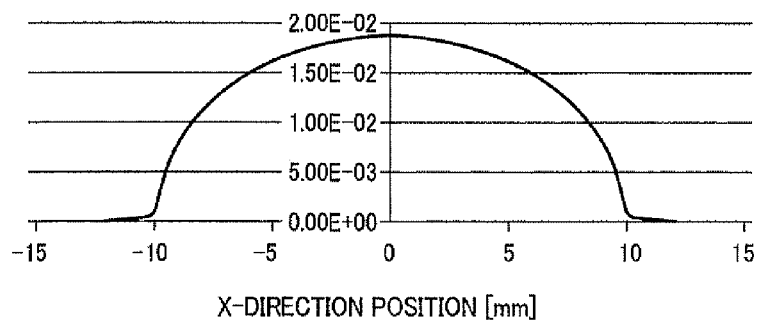
FIG. 11 are views indicating results of simulation of the intensity of a magnetic field within a wire to which a magnetic field was applied.

FIG. 11 are the views indicating results of simulation of the intensity of a magnetic field within a wire of a length of 20 mm and a diameter of 40 µm in a longitudinal direction of the wire when a magnetic field of 50 µT was applied to the wire in a direction parallel to the longitudinal direction of the wire. FIG. 11(a) indicates the result of the simulation where the connecting member 14 takes the form of one rod extending in its longitudinal direction. In this case, the magnetic field intensity is distributed symmetrically with respect to a lengthwise midpoint of the connecting member 14 (wire). Accordingly, the measuring sensor 12a and the reference sensor 12b can measure the same intensity value of the environmental magnetic field, where the measuring and reference sensors 12a and 12b are located symmetrically with respect to the midpoint of the wire.

Figure 11B:
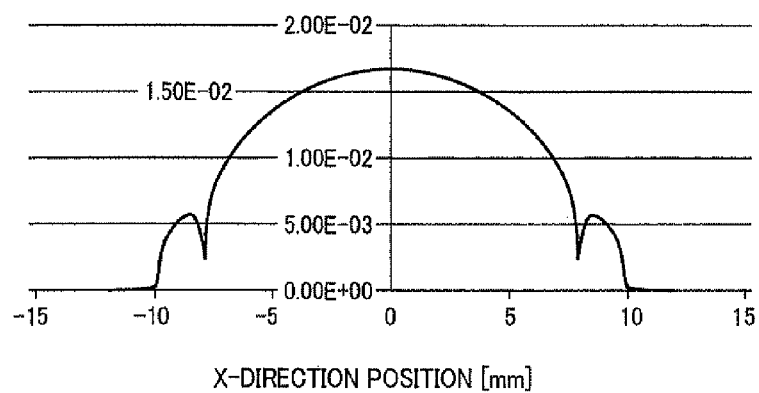

FIG. 11(b) indicates the result of the simulation where the connecting member 14 of the present embodiment is used, that is, where the connecting member 14 consists of the connector segments 14a, 14b and 14c. Each of the connector segments 14a and 14c have a length of 2 mm, while the connector segment 14b has a length of 16 mm. The dimension of the gaps T1 and T2 is 0.04 mm (40 µm) which is equal to the cross sectional diameter of the wire. In this case, it is recognized that the intensity of the magnetic field has drops at the positions of the gaps, that is, at the positions of +8 mm and −8 mm, but the amount of these intensity drops is small, so that the amount of leakage of the magnetic fluxes is accordingly small. As in the case of FIG. 11(a), the magnetic field intensity is distributed symmetrically with respect to the lengthwise midpoint of the connecting member 14 (wire), so that the measuring and reference sensors 12a, 12b can equally measure the environmental magnetic field, where the measuring and reference sensors 12a, 12b are located symmetrically with respect to the midpoint of the wire.

Figure 11C:
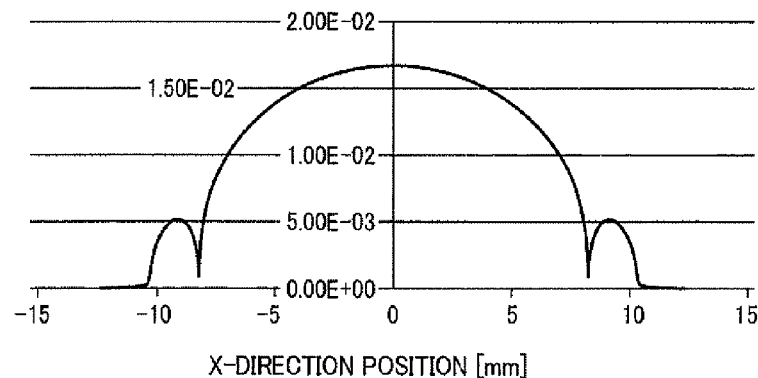

In the case of FIG. 11(c), the connecting member 14 consists of the connector segments 14a, 14b and 14c, as in the case of FIG. 11(b). The connector segments 14a and 14c have a length of 2 mm while the connector segment 14b has a length of 16 mm, also as in the case of FIG. 11(b). On the other hand, the dimension of the gaps T1 and T2 is 0.1 mm (100 µm) which is larger than the cross sectional diameter of the wire. In this case, it is recognized that the intensity of the magnetic field has drops at the positions of the gaps, that is, at the positions of +8 mm and −8 mm, and the amount of these intensity drops is large with the intensity being almost zeroed, so that the amount of leakage of the magnetic fluxes and the amount of introduction of the external magnetic fluxes into the gaps are accordingly large. Therefore, the measuring and reference sensors 12a and 12b corresponding to the respective connector segments 14a and 14c in such a wire have difficulty to equally measure the environmental magnetic field.

Figure 12:
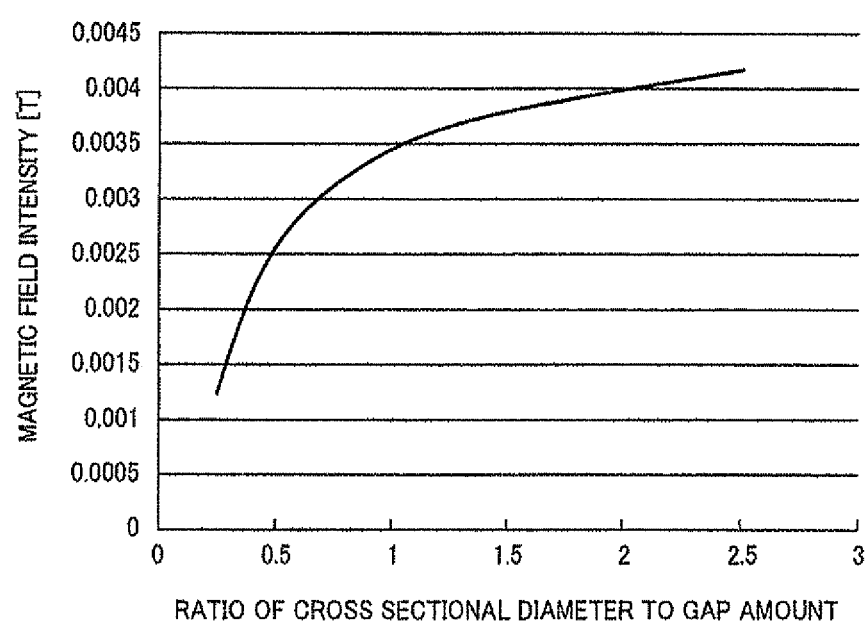
FIG. 12 is a view indicating a relationship between a ratio of a cross sectional diameter to a gap amount, and the magnetic field intensity.

FIG. 12 is the view indicating a relationship between a ratio of the cross sectional diameter to the gap amount, and the magnetic field intensity at the positions of the gaps. It will be understood from FIG. 12 that the amount of drop of the magnetic field intensity at the position of the gaps abruptly increases with a decrease of the ratio from "1", that is, the amount of drop of the magnetic field intensity increases as the dimension of the gaps becomes larger than the cross sectional diameter of the wire, and that it is impossible to enjoy the same advantage as obtained where the two connector segments adjacent to each other via the gap are substantially connected in series to each other within the magnetic circuit.

Where the magnetic impedance sensors are used for the magneto-sensors 12 in the present embodiment, the connector segment 14a extending through the hollow portion of the measuring sensor 12a, and the connector segment 14b extending through the hollow portion of the reference sensor 12b are electrically connected to each other by the electrically conductive body 18, so that an electric current is applied to the connector segments 14a and 14b constituted by the amorphous wires.

In the present embodiment, the connector segments 14a, 14b and 14c may be formed of the same magnetic material, or the intermediate connector segment 14b may be formed of a magnetic material different from that of the connector segments 14a and 14c. Although the number of the connector segments is not limited to three as in the present embodiment, the number of the connector segments is preferably selected so that the connector segments are arranged symmetrically with respect to the longitudinal midpoint of the connecting member 14, to permit the measuring and reference sensors 12a and 12b to equally detect the external magnetic field (environmental magnetic field), owing to the symmetrical distribution of the magnetic field intensity with respect to the longitudinal midpoint with regard to the whole of the connecting member 14.

The connector segment 14b other than the connector segments 14a and 14c corresponding to the magneto-sensors 12 is preferably formed of a magnetic material having a relative magnetic permeability of at least 100, because the distribution of the magnetic field intensity in the connecting member 14 has points of inflection, which gives rise to an abrupt variation of the magnetic field intensity depending upon the longitudinal position, where the relative magnetic permeability of the connector segment 14b is not higher than the above-indicated lower limit.

Figure 13A:
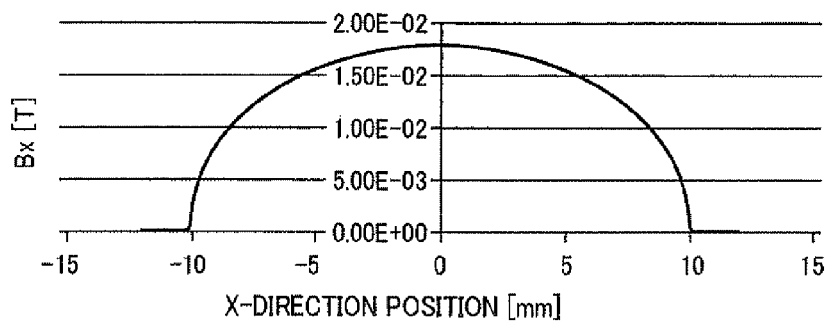
FIG. 13 are views corresponding to those of FIG. 11, indicating results of simulation of the intensity of the magnetic field within the wire, where an intermediate connector segment of the connecting member is formed of a magnetic body different from that of opposite end connector segments of the connecting member.
Figure 13B:
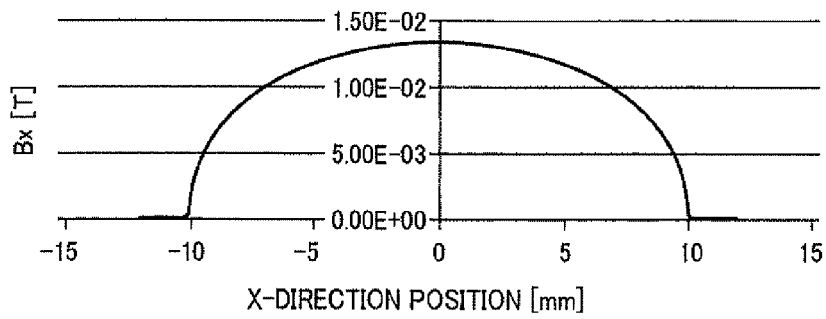
Figure 13C:
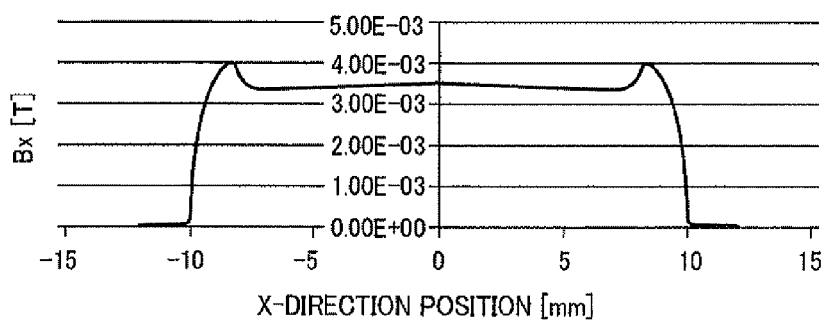

FIG. 13 are the views indicating results of simulation of the intensity of the magnetic field of the wire in its longitudinal direction, under the same condition of simulation as that of FIG. 11, where the intermediate connector segment 14b is formed of a magnetic body different from that of the other connector segments 14a and 14c. In the cases of FIGS. 13(a) through 13(c), the relative magnetic permeability of the connector segments 14a and 14c is 15000. The relative magnetic permeability of the connector segment 14b is 5000 in the case of FIG. 13(a), 1000 in the case of FIG. 13(b), and 100 in the case of FIG. 13(c).

Comparing FIGS. 13(a) and 13(b) wherein the relative magnetic permeability of the connector segment 14b is higher than 100, the magnetic field intensity in the connecting member 14 is symmetrically distributed with respect to the longitudinal midpoint of the connecting member 14, and smoothly changes. In the case of FIG. 13(c) wherein the relative magnetic permeability of the connector segment 14b is 100, on the other hand, the distribution of the magnetic field intension in the connecting member 14 which is also symmetrical with respect to the longitudinal midpoint of the connecting member 14 has points of inflection. Where the amount of abrupt change of the magnetic field intensity is larger than in the case of FIG. 13(c), the measuring and reference sensors 12a and 12b have difficulty to equally detect the external magnetic field (environmental magnetic field).

Figure 14:
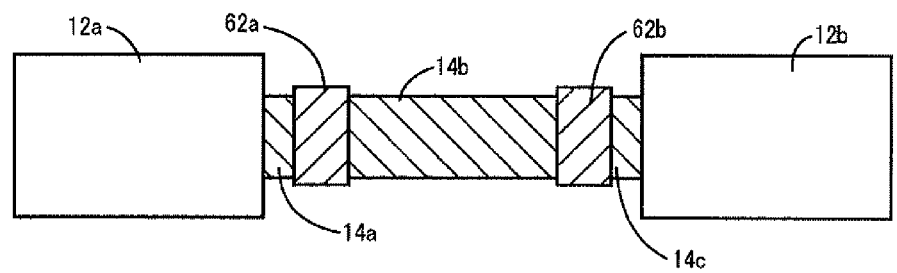
FIG. 14 is a view corresponding to that of FIG. 10, for explaining a further type of the connecting member.

While the gaps T1 and T2 are mere gaps in the cases of FIG. 11, the gaps T1 and T2 may be filled with respective magnetic bodies 62a and 62b formed of a magnetic material different from that of the connecting member 14, as indicated in FIG. 14. In this case, the relative magnetic permeability of the magnetic bodies 62a, 62b is preferably at least 100, for the same reason as described above.

The second embodiment described above is configured such that the connecting member 14 consists of a plurality of connector segments 14a, 14b and 14c, so that the magneto-sensors 12 are not electrically connected in series to each other within the magnetic circuit, in a strict sense. However, the second embodiment permits the two magneto-sensors 12 to equally detect the external magnetic field applied thereto, and has the same advantage as the first embodiment.

The above-described second embodiment is further configured such that the gaps T1 and T2 are filled with the magnetic bodies having the relative magnetic permeability of at least 100, so that the measuring and reference sensors 12a and 12b, which are not electrically connected in series to each other within the magnetic circuit in a strict sense, due to the use of the plurality of connector segments 14a, 14b and 14c as the connecting member 14, has the same advantage as the first embodiment.

Third Embodiment

Figure 15:
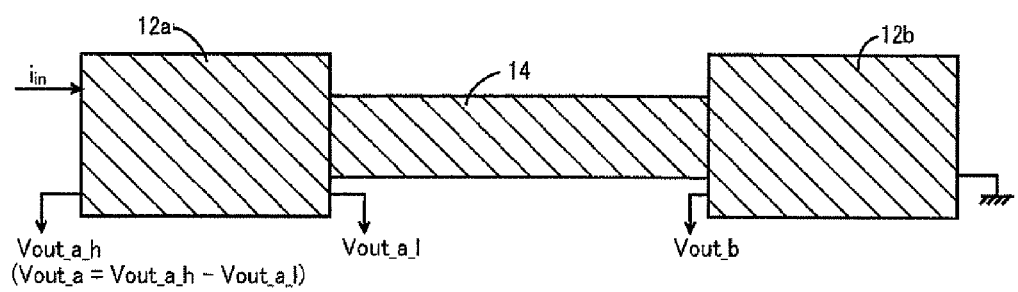
FIG. 15 is a view corresponding to that of FIG. 10, for explaining magneto-sensors, and a still further type of the connecting member.

FIG. 15 is the view for explaining the magneto-sensors 12 having a still further type of the connecting member 14 in the magnetic-field detecting device of the present invention. In the above-described first and second embodiments, the measuring and reference sensors 12a and 12b use the detecting coils 13 as the sensing portions, and the amorphous wire as the connecting member 14 extending through the hollow space of the detecting coils 13. Where the magneto-sensors 12 are magnetic impedance sensors, the magnetic field can be detected by detecting a voltage across the opposite ends of the amorphous wire to which an electric current pulse is applied.

The magneto-sensors 12 and the connecting member 14 in the embodiment of FIG. 15 take the form of a one-piece body formed of an amorphous material. Namely, the magnetism sensing portion of the measuring sensor 12a, the magnetism sensing portion of the reference sensor 12b, and the connecting member 14 are provided by a single member. In this embodiment, the electric current applied to the connecting member and the voltage across the opposite ends of the magneto-sensors 12 are input and detected at the positions indicated in FIG. 15. In this embodiment, too, the measuring and reference sensors 12a and 12b are connected by the connecting member 14 in series to each other within the magnetic circuit, so that the same advantage as obtained in the first embodiment is obtained.

In the third embodiment described above, the magnetism sensing portions of the magneto-sensors 12 and the connecting member 14 are formed of the same material as a one-piece body, so that the magnetism sensing portions and the connecting member 14 can be easily produced.

Fourth Embodiment

Figure 16:
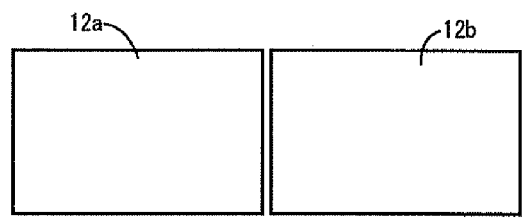
FIG. 16 is a view corresponding to that of FIG. 10, for explaining magneto-sensors, and a yet further type of the connecting member.

FIG. 16 is the view for explaining the magneto-sensors 12 having a yet further type of the connecting member 14 in the magnetic-field detecting device of the present invention. In the above-described embodiments, the measuring sensor 12a and the reference sensor 12b are spaced apart from each other by a suitable distance so that the measuring sensor 12a detects the magnetic field generated by the subject 50 while the reference sensor 12b does not detect the magnetic field generated by the subject 50. In the present embodiment, on the other hand, the magneto-sensors 12 are impedance sensors as in the preceding embodiments, but do not have the detecting coils, and the amorphous wire 14 also functions as the sensing portions 13. Further, as shown in FIG. 16 by way of example, the measuring and reference sensors 12a and 12b are disposed close to each other to an extent that prevents the reference sensor 12b from detecting the magnetic field generated by the subject 50. In the present embodiment, the amount of a gap between the measuring and reference sensors 12a, 12b is determined to be not larger than the cross sectional diameter of the connecting member i.e. the amorphous wire 14, so that it is possible to enjoy the same advantage as obtained where the measuring and reference sensors 12a and 12b are connected in series to each other within the magnetic circuit as described in the embodiment 2.

The above-described fourth embodiment is characterized in that the magnetism sensing portions of the magneto-sensors 12 are disposed close to each other via the gap having a dimension not larger than the cross sectional diameter of the connecting member 14, or disposed in contact with each other. A relatively short distance between the magneto-sensors 12 makes it possible to reduce the overall size of the magnetic-field detecting device.

Fifth Embodiment

Figure 17:
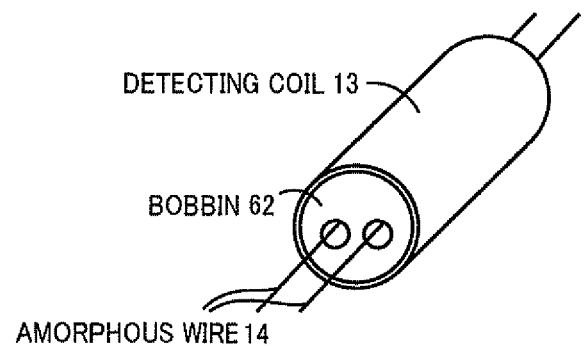
FIG. 17 is a view for explaining a plurality of amorphous wires provided as the connecting member for the magneto-sensors.

FIG. 17 is the view for explaining another type of the magneto-sensors 12 in the magnetic-field detecting device of the present invention. In the above-described embodiments, one amorphous wire 14 used as the connecting member extends through the hollow portions of the detecting coils 13 of the magneto-sensors 12. The embodiment of FIG. 17 is different from the preceding embodiments in that a plurality of amorphous wires 14 are provided. In the embodiment of FIG. 17, the plurality of amorphous wires 14 extend through respective holes formed through bobbins 62 disposed within the respective opposite end portions of each of the detecting coils 13, so that the plurality of amorphous wires 14 extending through the detecting coils 13 are prevented from contacting with each other.

The use of the plurality of amorphous wires 14 makes it possible to increase an overall surface current of the connecting member 14, resulting in an improvement of the resolution of the magnetic impedance sensors.

Sixth Embodiment

Figure 18:
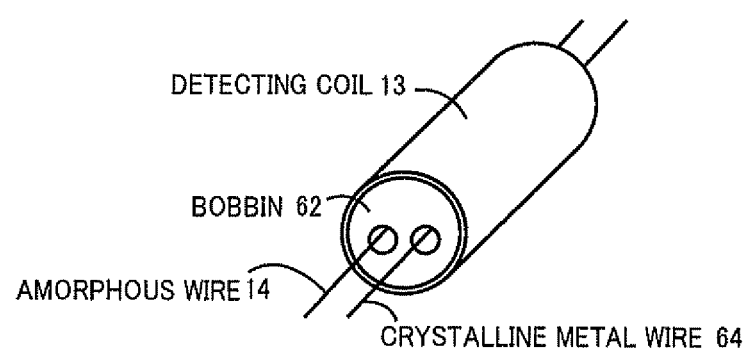
FIG. 18 is a view for explaining an amorphous wire and a crystalline metal wire provided as the connecting member for the magneto-sensors.

FIG. 18 is the view for explaining a further type of the detecting coil 13. In the embodiment of FIG. 18, the bobbins 62 are disposed within the respective opposite end portions of each detecting coil 13, and a plurality of holes are formed through each of the bobbins 62, as in the embodiment of FIG. 17. A crystalline metal wire 64 as well as the amorphous wire 14 as the connecting member, are provided extending through the respective holes of the bobbins 62 so that the crystalline metal wire 64 is electrically insulated from the amorphous wire 14. The crystalline metal wire 64 is formed from a metallic wire having electrical properties such as an electric resistance, which are similar or approximately equal to those of the amorphous wire. For instance, the metallic wire is a nichrome wire.

A variation of the impedance of any article surrounding the magneto-sensors 12 causes generation of an electric noise, so that the magnetic field intensity detected by application of an electric current to the amorphous wire includes the generated electric noise. On the other hand, the generated electric noise can be detected when the magnetic field intensity is detected by application of an electric current to the crystalline metal wire. According to the present magneto-sensors 12, a difference between the magnetic field intensity initially detected by application of the electric current to the amorphous wire and the magnetic field intensity subsequently detected by application of the electric current to the crystalline metal wire accurately represents the intensity of the magnetic field desired to be detected. The present arrangement is advantageous particularly when the subject is a living body.

Figure 19:
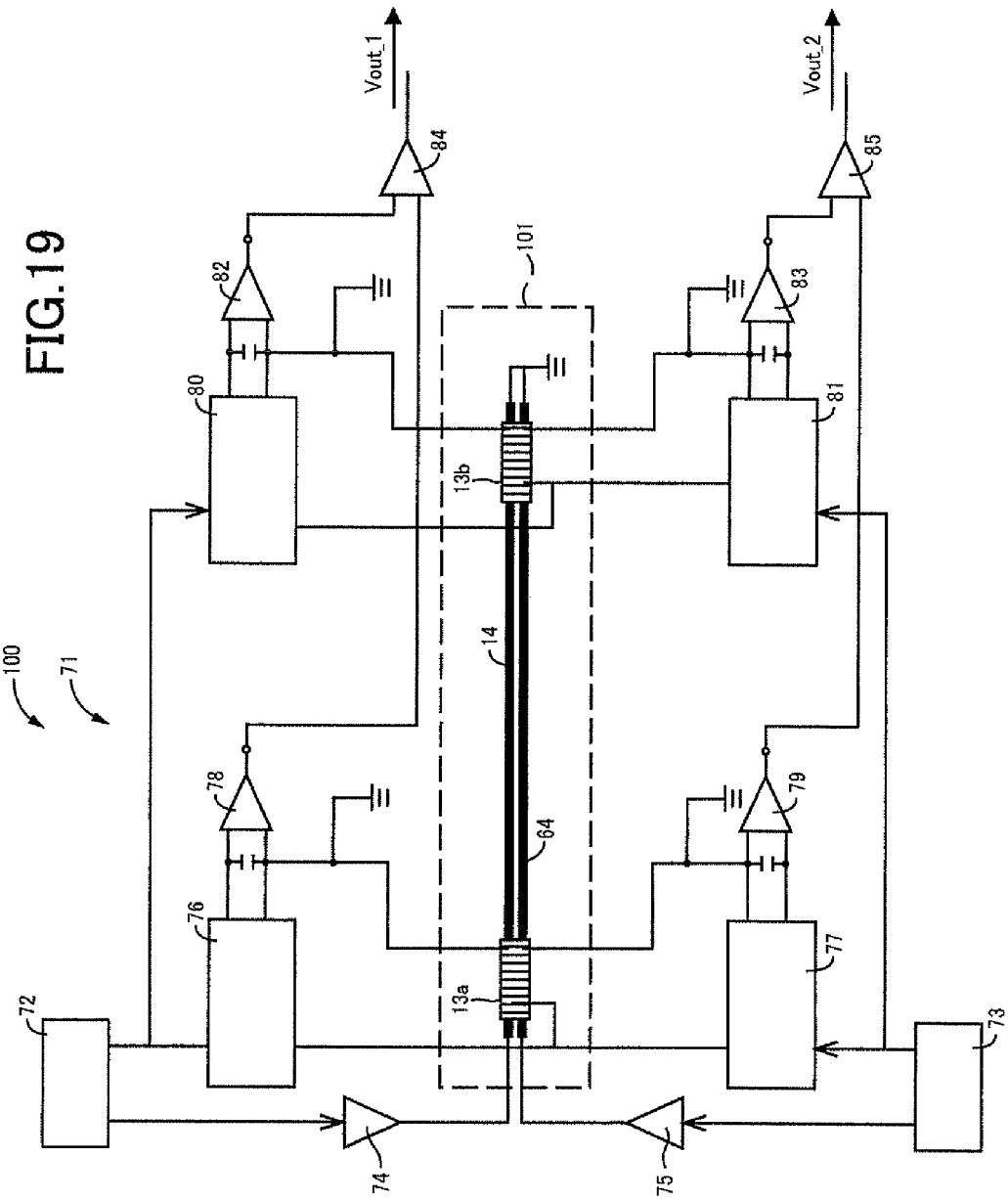
FIG. 19 is a view corresponding to that of FIG. 2, for explaining major portions of a magnetic-field detecting device including a detecting coil shown in FIG. 18.

FIG. 19 is the view for explaining major portions of a magnetic-field detecting device 100 including a sensor head 101 provided with the detecting coils 13 shown in FIG. 18, and a circuit portion 71. FIG. 19 corresponds to that of FIG. 2 showing the above-described embodiment. The circuit portion 71 shown in FIG. 19 corresponds to the circuit portion 21 of the magnetic-field detecting device 10 of FIG. 2. Namely, FIG. 19 shows a portion of the circuit portion 71, at which the circuit portion 71 applies and receives signals to and from the sensor head 101. Oscillators 72 and 73 of the circuit portion 71 shown in FIG. 19 correspond to the oscillator 22 of FIG. 2. The oscillators 72, 73 are configured to generate pulse signals or rectangular waves on the basis of which electric currents $i_{in}$ are applied to the amorphous wire 14 and the crystalline metal wire 64. The pulse signals (rectangular waves) generated from the oscillators 72, 73 are amplified by a predetermined amount by respective amplifiers 74 and 75 each corresponding to the amplifier 24 of FIG. 2, and the amplified pulse signals are respectively applied to the amorphous wire 14 and the crystalline metal wire 64. The application of the pulse signal from the oscillator 72 and amplifier 74 to the amorphous wire 14, and the application of the pulse signal from the oscillator 73 and amplifier 75 to the crystalline metal wire 64 are alternately conducted at a predetermined time interval, for instance.

Sample-hold circuits 76 and 77 corresponding to the sample-hold circuit 26 of FIG. 2 receive a potential difference (electromotive force) across the opposite ends of the detecting coil 13a. The sample-hold circuit 76 is provided to detect the voltage of the detecting coil 13a when the electric current is applied from the above-indicated oscillator 72 to the amorphous wire 14, while the sample-hold circuit 77 is provided to detect the voltage of the detecting coil 13a when the electric current is applied from the above-indicated oscillator 73 to the crystalline metal wire 64. Buffer amplifiers 78 and 79, which correspond to the buffer amplifier 28 of FIG. 2, feed the outputs of the sample-hold circuits 76 and 77 to downstream elements.

Sample-hold circuits 80 and 81 corresponding to the sample-hold circuit 30 of FIG. 2 receive a potential difference (electromotive force) across the opposite ends of the detecting coil 13b. The sample-hold circuit 80 is provided to detect the voltage of the detecting coil 13b when the electric current is applied from the above-indicated oscillator 72 to the amorphous wire 14, while the sample-hold circuit 81 is provided to detect the voltage of the detecting coil 13b when the electric current is applied from the above-indicated oscillator 73 to the crystalline metal wire 64. Buffer amplifiers 82 and 83, which correspond to the amplifier 32 of FIG. 2, feed the outputs of the sample-hold circuits 80 and 81 to downstream elements.

Differential amplifiers 84 and 85 correspond to the differential amplifier 34 of FIG. 2. The differential amplifier 84 amplifies a difference between the outputs of the sample-hold circuits 76 and 80, and generates the amplified difference as an output $v_{out\_1}$. Described more specifically, the differential amplifier 84 calculates a difference between an output of the buffer amplifier 78 relating to the detecting coil 13a of the measuring sensor 12a, and an output of the buffer amplifier 82 relating to the detecting coil 13b of the reference sensor 12b, and outputs the calculated difference. On the other hand, the differential amplifier 85 amplifies a difference between the outputs of the sample-hold circuits 77 and 81, and generates the amplified difference as an output $V_{out\_2}$. Described more specifically, the differential amplifier 85 calculates a difference between an output of the buffer amplifier 79 relating to the detecting coil 13a of the measuring sensor 12a, and an output of the buffer amplifier 83 relating to the detecting coil 13b of the reference sensor 12b, and outputs the calculated difference.

As described above, the output $v_{out\_1}$ is the output which is obtained upon application of the electric current to the amorphous wire 14 and which includes an influence of an electric noise (magnetic field noise) present around the magnetic-field detecting device 10. On the other hand, the output $v_{out\_2}$ is the output which is obtained upon application of the electric current to the crystalline metal wire 64 and which does not include an influence of the ambient magnetic field and includes the influence of the above-indicated electric noise. A difference obtained by a differential amplifier (not shown) by subtracting the output $v_{out\_2}$ from the output $v_{out\_1}$ is used as an output $v_{out}$ which is less likely to be influenced by the electric noise and which represents the magnetic field with a higher degree of accuracy.

Seventh Embodiment

Figure 20:
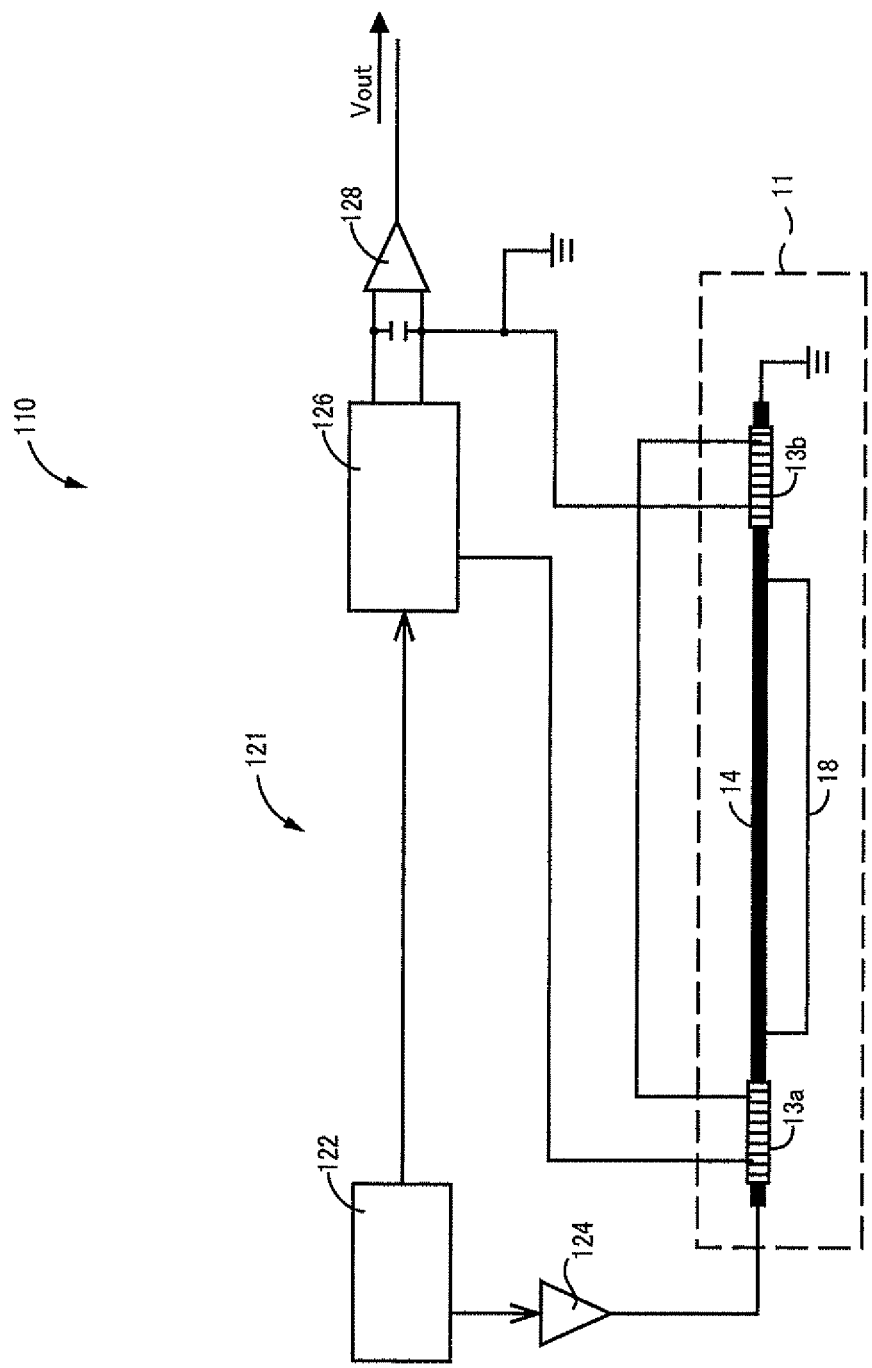
FIG. 20 is a view corresponding to that of FIG. 2, for explaining an arrangement of a magnetic-field detecting device constructed according to another embodiment of this invention.

FIG. 20 is the view for explaining a further embodiment of a magnetic-field detecting device of this invention. In the embodiments described above, the influence of the environmental magnetic field is reduced by the differential amplifier configured to obtain the difference between the output of the measuring sensor 12a and the output of the reference sensor 12b, as shown in FIGS. 2 and 19 referred to above. A magnetic-field detecting device 110 according to the present embodiment is configured such that electromotive forces generated by the detecting coil 13a of the measuring sensor 12a and the detecting coil 13b of the reference sensor 12b upon application of the electric current pulse to the amorphous wire 14 have respective opposite phases and such that the detecting coils 13a and 13b are electrically connected in series to each other. Described more specifically, the detecting coils 13a and 13b have the same direction of winding, and are connected to each other at the same one of their opposite ends (for example, at the corresponding right ends of the detecting coils 13a and 13b, as shown in FIG. 20), while at the same time the magnetic-field detecting device is wired so as to detect a voltage between the other ends of the detecting coils 13a and 13b (for example, at the corresponding left ends of the detecting coils 13a and 13b, as shown in FIG. 20).

An oscillator 122 shown in FIG. 20, which corresponds to the oscillator 22 of FIG. 2, generates a pulse signal, namely, a rectangular wave on the basis of which the electric current $i_{in}$ is applied to the amorphous wire 14. The pulse signal (rectangular wave) generated by the oscillator 122 is amplified by a predetermined amount by an amplifier 124, and the amplified pulse signal is applied to the amorphous wire 14. This amplifier 124 corresponds to the amplifier 24 of FIG. 2.

A sample-hold circuit 126 has the same function as the sample-hold circuit 26 or 30 of FIG. 2, and receives the potential difference between the detecting coils 13a and 13b connected in series to each other as described above. An output of the sample-hold circuit 126 is provided through a buffer amplifier 128 as an output $v_{out}$.

As described above, the magnetic-field detecting device 110 according to the present embodiment is configured such that the detecting coils 13a and 13b are electrically connected in series to each other such that the electromotive forces generated by the detecting coil 13a of the measuring sensor 12a and the detecting coil 13b of the reference sensor 12b upon application of the electric current pulse to the amorphous wire 14 have the respective opposite phases, so that the electromotive forces generated by the terrestrial magnetism and other external magnetic field and detected by both of those two detecting coils 13a and 13b are mutually offset by each other, whereby the obtained potential difference between the opposite ends of each of the detecting coils 13a and 13b connected in series to each other represents only the electromotive force based on the magnetic field generated by the subject 50. Accordingly, the two sensors 12 can detect the magnetism signal by their differential function, without having to use a differential amplifier (corresponding to the differential amplifier 34 of FIG. 2) for calculating a difference between the outputs of the detecting coils 13a and 13b.

While the embodiments of the present invention have been described above in detail by reference to the drawings, it is to be understood that the invention may be otherwise embodied.

Although the magnetic impedance sensors are used as the magneto-sensors 12 in the illustrated embodiments, the magneto-sensors are not limited to the magnetic impedance sensors. For example, magneto-sensors in the form of hole elements may be used according to the present invention.

Where a plurality of amorphous wires are used as the connecting member 14 as described above, the plurality of amorphous wires are preferably connected in electrically parallel to each other. In this case, the amount of an electric current flowing through the connecting member 14 can be increased, so that the surface current of the connecting member 14 can be increased.

In the illustrated sixth embodiment, the metal wire 64 is provided for both of the measuring sensor 12a and the reference sensor 12b. However, the provision of the metal wire 64 for both of the measuring and reference sensors is not essential, and the provision of the crystalline metal wire 64 for at least one of the magneto-sensors 12, that is the measuring sensor 12a, is considered to give a certain advantageous effect.

In the illustrated seventh embodiment, the detecting coils 13a and 13b have the same direction of winding, and are connected to each other at the same one of their opposite ends (for example, at the corresponding right ends of the detecting coils 13a and 13b, as shown in FIG. 20), while at the same time the magnetic-field detecting device is wired so as to detect a voltage between the other ends (i.e., ends not for connecting the two coils) of the detecting coils 13a and 13b (for example, at the corresponding left ends of the detecting coils 13a and 13b, as shown in FIG. 20). However, this arrangement is not essential. For instance, the detecting coils 13a and 13b may have the respective opposite directions of winding, and are connected to each other at the respective different ends (for example, at the right end of the detecting coil 13a and at the left end of the detecting coil 13b, as seen in FIG. 20), while at the same time the magnetic-field detecting device is wired so as to detect a voltage between the other ends of the detecting coils 13a and 13b (for example, at the left end of the detecting coil 13a and at the right end of the detecting coil 13b, as seen in FIG. 20). Namely, the pair of detecting coils 13a and 13b are only required to be connected in series to each other such that the electromotive forces generated by the magnetic field and detected by both of the two detecting coils 13a and 13b are mutually offset by each other, and so that the potential difference between the opposite ends of each of the detecting coils 13a and 13b connected in series to each other can be detected.

In the illustrated embodiments wherein the magneto-sensors are magnetic impedance sensors having respective coils, the connector segments 14a and 14c project from the hollow portions of the magneto-sensors 12a and 12b in the longitudinal direction toward the connector segment 14b, as shown in FIGS. 10 and 14, for example. However, this arrangement is not essential. That is, the length of the connector segments 14a and 14c may be equal to that of the magneto-sensors 12a and 12b, more specifically, equal to that of the detecting coils 13a and 13b, or the length of the connector segment 14b may be increased so as to extend into the detecting coils 13a and 13b.

In the illustrated embodiments, the sensor head 11 is provided with the shielding member 20 and the covering portion 16. However, these shielding member and covering portion are not essential elements of the sensor head 11, and a certain advantageous effect can be obtained without at least one of the shielding member and covering portion.

In the illustrated second embodiment, each of the connector segments 14a, 14b and 14c is provided by an amorphous wire. However, this arrangement is not essential. That is, those ones of the above-indicated connector segments 14a-14c which extend through the magneto-sensors 12 (which correspond to the magnetism sensing portions of the magneto-sensors 12, and which are the connector segments 14a and 14c in the example of FIG. 10) are provided by the amorphous wire, while the other connector segment (which is the connector segment 14b in the example of FIG. 10) is formed of a magnetic material having a small coercive force, such as a ferrite, a permalloy and an amorphous alloy, for example, which has a relative magnetic permeability of at least 100, or a relative magnetic permeability which is at least $1/100$ of that of a magnetic material of the above-described magnetism sensing portions. In this case, too, the same advantage as described above with respect to the illustrated second embodiment can be obtained.

In the illustrated first embodiment, the parallel conductive body 18 formed of an electrically conductive material is electrically connected in parallel to an inner portion of the amorphous wire 14 which is intermediate between the two detecting coils 13. However, the parallel conductive body 18 is not essential, and the first embodiment provides a certain degree of advantage even in the absence of the parallel conductive body 18.

Although the illustrated embodiments have been described above, it is to be understood that the present invention may be embodied with various other changes, which may occur without departing from the spirit and scope of the invention.

NOMENCLATURE OF REFERENCE SIGNS 10, 100, 110: Magnetic-field detecting device
11, 101: Sensor head
12: Magneto-sensors
13: Detecting portion (Detecting coils)
14: Connecting member (Amorphous wire)
16: Covering portion
18: Parallel conductive body
20: Shielding member
50: Subject

The invention claimed is:

1. A magnetic-field detecting device comprising a pair of magneto-sensors including respective magnetism sensing portions each configured to detect a magnetism, and respective coils configured to sense changes of magnetic fluxes in said magnetism sensing portions, and an elongate connecting member cooperating with the magnetism sensing portions of said pair of magneto-sensors to constitute a magnetic circuit,
  wherein a magnetism sensing direction of the magnetism sensing portions of said pair of magneto-sensors coincides with a longitudinal direction of said connecting member to an extent such that the coils are configured to equally sense a magnetic field applied to both of said magnetism sensing portions, and the magnetic sensing portions are identical and located symmetrically at distal ends with respect to a longitudinal midpoint of said magnetic circuit such that the magnetic field applied to both of said magnetism sensing portions is equally detected,
  said connecting member being formed of a magnetic material having a relative magnetic permeability of at least 100, a magnetic material having a relative magnetic permeability which is at least $1/100$ of that of a magnetic material of said magnetism sensing portions, or the same magnetic material as the magnetism sensing portions of said magneto-sensors, and
  said magnetic-field detecting device being configured to measure the magnetism on the basis of a difference between outputs of the coils of said pair of magneto-sensors.

2. The magnetic-field detecting device according to claim 1, wherein said connecting member consists of a plurality of connector segments, and said plurality of connector segments are spaced apart from each other by gaps having dimensions not larger than a cross sectional diameter of connecting portions of said connecting member, or disposed in contact with each other.

3. The magnetic-field detecting device according to claim 2, wherein said gaps are filled with magnetic bodies having a relative magnetic permeability of at least 100.

4. The magnetic-field detecting device according to claim 1, wherein the magnetism sensing portions of said pair of magneto-sensors and said connecting member are formed of a same material as a one-piece body.

5. The magnetic-field detecting device according to claim 1, wherein the magnetism sensing portions of said pair of magneto-sensors are disposed close to each other via a gap having a dimension not larger than a cross sectional diameter of connecting portions of said magnetism sensing portions, or disposed in contact with each other.

6. The magnetic-field detecting device according to claim 1, further comprising a magnetic shielding member for shielding a subject to be measured, and said pair of magneto-sensors.

7. The magnetic-field detecting device according to claim 1, further comprising a grounded covering portion which is formed of a non-magnetic electrically conductive material and which covers at least the magnetism sensing portions of said pair of magneto-sensors.

8. The magnetic-field detecting device according to claim 1, wherein said pair of magneto-sensors are magnetic impedance sensors, and the magnetism sensing portions of said pair of magneto-sensors are provided by an amorphous wire, while said connecting member is an electrically conductive body,
the magnetic-field detecting device further comprising a parallel conductive body which is electrically connected in parallel to said connecting member and which is formed of a non-magnetic electrically conductive material.

9. The magnetic-field detecting device according to claim 1, wherein said pair of magneto-sensors are magnetic impedance sensors, and the magnetism sensing portions of said pair of magneto-sensors are provided by a plurality of amorphous wires,
and wherein said plurality of amorphous wires are electrically connected in parallel to each other.

10. The magnetic-field detecting device according to claim 1, wherein said pair of magneto-sensors are magnetic impedance sensors, while the magnetism sensing portions of said pair of magneto-sensors are provided by an amorphous wire,
and wherein at least one of said pair of magneto-sensors is provided with a crystalline metal wire which is electrically insulated from said amorphous wire and disposed along said amorphous wire.

11. The magnetic-field detecting device according to claim 1, wherein said pair of magneto-sensors are magnetic impedance sensors, while the magnetism sensing portions of said pair of magneto-sensors are provided by an amorphous wire,
and wherein a stray capacitance of said coils is determined such that a variation of an induced voltage generated by each of said detecting coils upon initiation of application of an electric current to said amorphous wire, and a variation of an induced voltage generated by said coil upon termination of application of the electric current to said amorphous wire take place continuously.

12. The magnetic-field detecting device according to claim 1, wherein said pair of magneto-sensors are magnetic impedance sensors, while the magnetism sensing portions of said pair of magneto-sensors are provided by an amorphous wire,
and wherein the magnetic-field detecting device measures: a value of integration of a variation of an induced voltage generated by each of said coils as a result of initiation of application of an electric current to said amorphous wire, during a time period including a moment of a peak value of said variation; a value of integration of a variation of an induced voltage generated by said each coil as a result of termination of application of the electric current to said amorphous wire, during a time period including a moment of a peak value of said variation; or a value obtained by subtracting the value of integration of the variation of the induced voltage generated by said each coil as the result of termination of application of the electric current to said amorphous wire during the time period including the moment of the peak value of said variation, from the value of integration of the variation of the induced voltage generated by said each coil as the result of initiation of application of the electric current to said amorphous wire during the time period including the moment of the peak value of said variation.

13. The magnetic-field detecting device according to claim 1, wherein said pair of magneto-sensors are magnetic impedance sensors, while the magnetism sensing portions of said pair of magneto-sensors are provided by an amorphous wire,
and wherein a width of a pulse of an electric current to be applied to said amorphous wire has a value almost corresponding to a half of a reciprocal of a frequency at which an impedance of said magnetic impedance sensors with respect to the magnetic field has an outstanding change.

14. The magnetic-field detecting device according to claim 1, wherein said pair of magneto-sensors are magnetic impedance sensors, while the magnetism sensing portions of said pair of magneto-sensors are provided by an amorphous wire,
and wherein a repeating frequency of a pulse of an electric current pulse to be applied to said amorphous wire is at least 10 kHz.

15. The magnetic-field detecting device according to claim 1, wherein said pair of magneto-sensors are magnetic impedance sensors, while the magnetism sensing portions of said pair of magneto-sensors are provided by an amorphous wire,
and wherein the coils of said pair of magneto-sensors are electrically connected in series to each other such that electromotive forces generated by the coils of said pair of magneto-sensors upon application of a pulse of an electric current to said amorphous wire have respective opposite phases.

* * * * *